(12) United States Patent
Nonomura

(10) Patent No.: US 9,147,617 B2
(45) Date of Patent: Sep. 29, 2015

(54) RESIN COATING DEVICE AND A RESIN COATING METHOD

(75) Inventor: Masaru Nonomura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 16 days.

(21) Appl. No.: 13/885,510

(22) PCT Filed: May 30, 2012

(86) PCT No.: PCT/JP2012/003558
§ 371 (c)(1),
(2), (4) Date: May 15, 2013

(87) PCT Pub. No.: WO2012/164931
PCT Pub. Date: Dec. 6, 2012

(65) Prior Publication Data
US 2013/0236991 A1  Sep. 12, 2013

(30) Foreign Application Priority Data

May 30, 2011  (JP) ................................ 2011-119989

(51) Int. Cl.
H01L 21/66 (2006.01)
H01L 33/50 (2010.01)
H01L 23/00 (2006.01)

(52) U.S. Cl.
CPC ................ H01L 22/12 (2013.01); H01L 24/97 (2013.01); H01L 33/50 (2013.01); *H01L 2224/49107* (2013.01); *H01L 2224/92247* (2013.01); *H01L 2924/12041* (2013.01); *H01L 2933/0041* (2013.01)

(58) Field of Classification Search
None
See application file for complete search history.

(56) References Cited

U.S. PATENT DOCUMENTS 8,269,410 B2  9/2012  Kijima et al.
2008/0137106 A1  6/2008  Ono
(Continued)

FOREIGN PATENT DOCUMENTS

JP  2007-005781 A  1/2007
JP  2007-066969 A  3/2007
(Continued)

OTHER PUBLICATIONS

International Search Report for PCT/JP2012/003558 dated Jun. 26, 2012.

*Primary Examiner* — Benjamin Sandvik
*Assistant Examiner* — Herve Assouman
(74) *Attorney, Agent, or Firm* — Pearne & Gordon LLP

(57) ABSTRACT

In a resin coating which is used in the manufacture of an LED package which is made by covering an LED element with resin that includes fluorescent substance, a light-passing member (43) on which the resin (8) is test coated for light emission characteristic measurement is carried on a light-passing member carrying unit (41), a deviation between a measurement result obtained after the light emission characteristic of the light that the resin (8) emits, when an light source unit (45), which is placed above, emits excitation light which excites the fluorescent substance, and irradiates the excitation light from above to the resin (8) which is coated on the light-passing member (43), is measured and the light emission characteristic prescribed beforehand is obtained, and an appropriate resin coating quantity with which the resin should be coated on the LED element is derived for practical production based on the deviation.

8 Claims, 19 Drawing Sheets

(56) References Cited

U.S. PATENT DOCUMENTS

| | | |
|---|---|---|
| 2009/0134415 A1 | 5/2009 | Morioka |
| 2009/0140630 A1 | 6/2009 | Kijima et al. |
| 2009/0286335 A1* | 11/2009 | Le Toquin ................. 438/15 |
| 2010/0081218 A1* | 4/2010 | Hardin ....................... 438/7 |
| 2010/0246160 A1* | 9/2010 | Ito et al. ................... 362/84 |
| 2011/0195531 A1* | 8/2011 | Sohn et al. ................ 438/16 |
| 2012/0267997 A1 | 10/2012 | Kijima et al. |
| 2013/0143343 A1 | 6/2013 | Kojima |
| 2013/0149801 A1 | 6/2013 | Kojima |

FOREIGN PATENT DOCUMENTS

| | | |
|---|---|---|
| JP | 2007-242717 A | 9/2007 |
| JP | 2008-050593 A | 3/2008 |
| JP | 2008-145300 A | 6/2008 |
| JP | 2009-130301 A | 6/2009 |
| JP | 2011-021062 A | 2/2011 |
| JP | 2011-096936 A | 5/2011 |
| JP | 2011-102004 A | 5/2011 |
| JP | 2012-094674 A | 5/2012 |
| JP | 2012-094675 A | 5/2012 |
| WO | 2012/023425 A1 | 2/2012 |

* cited by examiner

FIG. 2
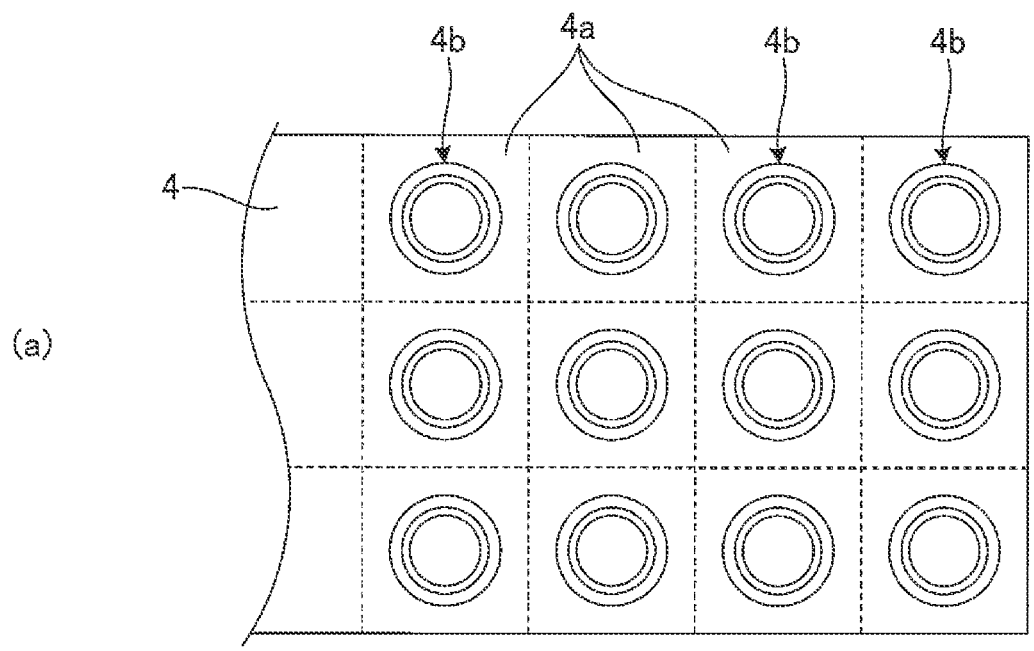
(a)
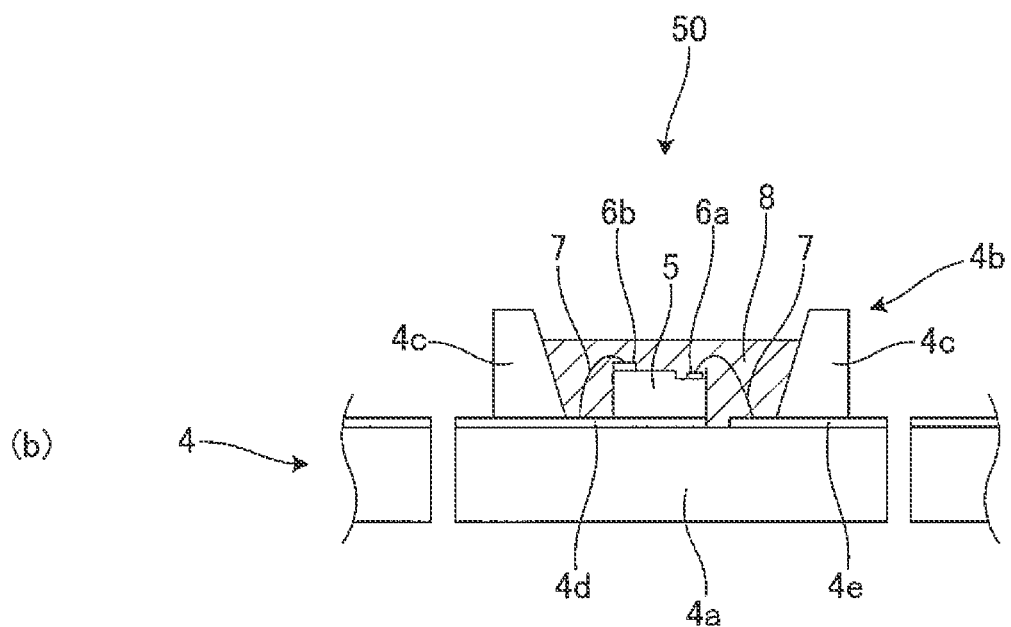
(b)

FIG. 9
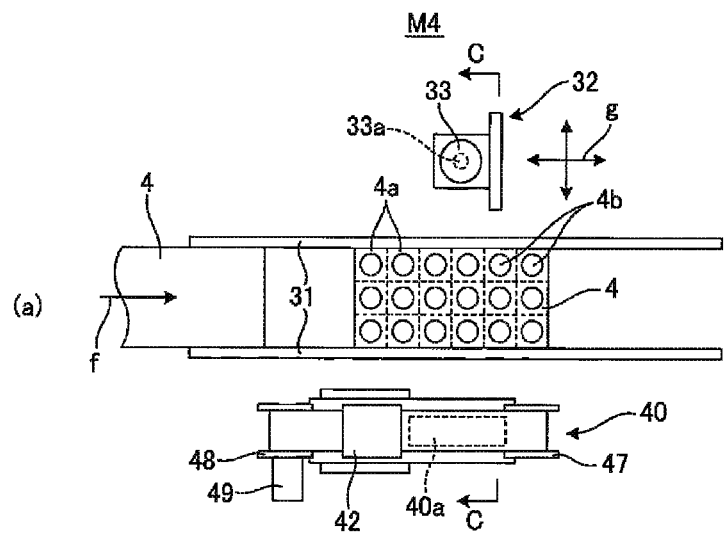
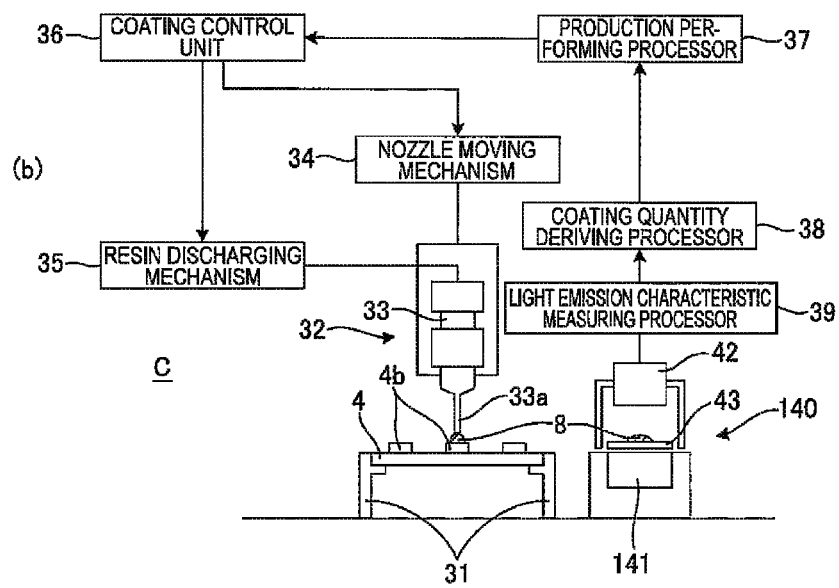

| | SHORT<<<(WAVELENGTH 465NM)>>>LONG | | | | |
|---|---|---|---|---|---|
| Bin CODES | [1] | [2] | [3] | [4] | [5] |
| APPROPRIATE RESIN COATING QUANTITIES (STANDARD 5% RESIN) | $V_{A0}$ | $V_{B0}$ | $V_{C0}$ | $V_{D0}$ | $V_{E0}$ |
| LIGHT EMISSION CHARACTERISTIC MEASUREMENT VALUES CHROMATICITY COORDINATES Z | $Z_{A0}$ $(X_{A0}, Y_{A0})$ | $Z_{B0}$ $(X_{B0}, Y_{B0})$ | $Z_{C0}$ $(X_{C0}, Y_{C0})$ | $Z_{D0}$ $(X_{D0}, Y_{D0})$ | $Z_{E0}$ $(X_{E0}, Y_{E0})$ |
| THRESHOLD DATA | $Z_{A0}$ ±10% | $Z_{B0}$ ±10% | $Z_{C0}$ ±10% | $Z_{D0}$ ±10% | $Z_{E0}$ ±10% |

(b)

| | SHORT<<<(WAVELENGTH 465NM)>>>LONG | | | | |
|---|---|---|---|---|---|
| Bin CODES | [1] | [2] | [3] | [4] | [5] |
| APPROPRIATE RESIN COATING QUANTITIES (STANDARD 10% RESIN) | $V_{F0}$ | $V_{G0}$ | $V_{H0}$ | $V_{J0}$ | $V_{K0}$ |
| LIGHT EMISSION CHARACTERISTIC MEASUREMENT VALUES CHROMATICITY COORDINATES Z | $Z_{F0}$ $(X_{F0}, Y_{F0})$ | $Z_{G0}$ $(X_{G0}, Y_{G0})$ | $Z_{H0}$ $(X_{H0}, Y_{H0})$ | $Z_{J0}$ $(X_{J0}, Y_{J0})$ | $Z_{K0}$ $(X_{K0}, Y_{K0})$ |
| THRESHOLD DATA | $Z_{F0}$ ±10% | $Z_{G0}$ ±10% | $Z_{H0}$ ±10% | $Z_{J0}$ ±10% | $Z_{K0}$ ±10% |

(c)

| | SHORT<<<(WAVELENGTH 465NM)>>>LONG | | | | |
|---|---|---|---|---|---|
| Bin CODES | [1] | [2] | [3] | [4] | [5] |
| APPROPRIATE RESIN COATING QUANTITIES (STANDARD 15% RESIN) | $V_{L0}$ | $V_{M0}$ | $V_{N0}$ | $V_{P0}$ | $V_{R0}$ |
| LIGHT EMISSION CHARACTERISTIC MEASUREMENT VALUES CHROMATICITY COORDINATES Z | $Z_{L0}$ $(X_{L0}, Y_{L0})$ | $Z_{M0}$ $(X_{M0}, Y_{M0})$ | $Z_{N0}$ $(X_{N0}, Y_{N0})$ | $Z_{P0}$ $(X_{P0}, Y_{P0})$ | $Z_{R0}$ $(X_{R0}, Y_{R0})$ |
| THRESHOLD DATA | $Z_{L0}$ ±10% | $Z_{M0}$ ±10% | $Z_{N0}$ ±10% | $Z_{P0}$ ±10% | $Z_{R0}$ ±10% |

FIG. 17

(a) TEST COATING

| | SHORT<<<(WAVELENGTH 465NM)>>>LONG | | | | |
|---|---|---|---|---|---|
| Bin CODES | [1] | [2] | [3] | [4] | [5] |
| REAL RESIN COATING QUANTITY | VA1 | VB1 | VC1 | VD1 | VE1 |

(b) LIGHT EMISSION CHARACTERISTIC MEASURING

| LIGHT EMISSION CHARACTERISTIC MEASUREMENT VALUES CHROMATICITY COORDINATES Z | $ZA1$ $(X_{A1}, Y_{A1})$ | $ZB1$ $(X_{B1}, Y_{B1})$ | $ZC1$ $(X_{C1}, Y_{C1})$ | $ZD1$ $(X_{D1}, Y_{D1})$ | $ZE1$ $(X_{E1}, Y_{E1})$ |
|---|---|---|---|---|---|
| DEVIATIONS | $\Delta X_A$ $\Delta Y_A$ | $\Delta X_B$ $\Delta Y_B$ | $\Delta X_C$ $\Delta Y_C$ | $\Delta X_D$ $\Delta Y_D$ | $\Delta X_E$ $\Delta Y_E$ |

(c) COMPARING THE DEVIATION WITH THE THRESHOLD

| DEVIATIONS | $\Delta X_A$ $\Delta Y_A$ | $\Delta X_B$ $\Delta Y_B$ | $\Delta X_C$ $\Delta Y_C$ | $\Delta X_D$ $\Delta Y_D$ | $\Delta X_E$ $\Delta Y_E$ |
|---|---|---|---|---|---|
| THRESHOLD | ZA0 ±10% | ZB0 ±10% | ZC0 ±10% | ZD0 ±10% | ZE0 ±10% |

DEVIATION ≤ THRESHOLD

THE COATING FOR PRODUCTION IS PERFORMED WITH THE SET APPROPRIATE RESIN COATING QUANTITIES VA0, VB0, VC0, VD0 AND VE0

DEVIATIONS> THRESHOLD DATA (d) DERIVING NEW APPROPRIATE RESIN COATING QUANTITIES

| | SHORT<<<(WAVELENGTH 465NM)>>>LONG | | | | |
|---|---|---|---|---|---|
| Bin CODES | [1] | [2] | [3] | [4] | [5] |
| REVISED APPROPRIATE RESIN COATING QUANTITIES | VA2 | VB2 | VC2 | VD2 | VE2 |

THE VA2, VB2, VC2, VD2 AND VE2 ARE DATA UPDATED BY ADDING REVISION AMOUNTS RESPECTIVELY CORRESPONDING TO THE DEVIATIONS TO THE VA0, VB0, VC0, VD0 AND VE0

RESIN COATING DEVICE AND A RESIN COATING METHOD

TECHNICAL FIELD

The present invention relates to a resin coating device and a resin coating method which are used in an LED package manufacturing system for manufacturing an LED package which is made by covering an LED element mounted on a board with resin that includes fluorescent substance.

BACKGROUND ART

In recent years, LEDs (light emitting diodes), which have superior characteristics such as less power consumption and long lifetime, are widely used as light sources of various illuminating devices. Because primary lights that the LED elements emit are limited to three colors, or red, green and blue at present, to obtain white light that is typically preferable in illumination, a method of obtaining white light by adding and mixing the above-mentioned three primary lights and a method of obtaining quasi-white light by combining a blue LED with fluorescent substance which emits yellow fluorescence which is complementary to blue are used. In recent years, the latter method comes to be used widely, and illuminating devices using LED packages which combine blue LEDs with YAG fluorescent substances are used for the backlights of liquid crystal panels and the like (for example, refer to a patent document 1).

In this patent document, after having mounted an LED element on the bottom surface of a concave mounting unit whose side wall forms a reflecting surface, by forming a resin packing unit by infusing silicone resin or epoxy resin, in which YAG-related fluorescent substance particles are dispersed, in the mounting unit, the LED package is constructed. An example is described in which, for the purpose of equalizing the height of the resin packing unit in the mounting unit after the resin infusion, a surplus resin reservoir is formed to drain and collect surplus resin infused above a prescribed quantity from the mounting unit. Thereby, even if the discharging quantity from a dispenser at the time of resin infusion varies, the resin packing unit of a prescribed height, which has constant quantity of resin, is formed on the LED element.

RELATED ART DOCUMENTS

Patent Documents

Patent document 1: Japan Patent Publication No. 2007-66969

SUMMARY OF THE INVENTION

Problem to be Solved by the Invention

However, in the above-mentioned related art example, due to the variation of the light emission wavelength of the individual LED element, there is a problem that the light emission characteristics of the LED package as a finished product vary. That is, the LED element is subject to a manufacturing process in which a plurality of elements are collectively elaborated on a wafer. Due to various kinds of deviation factors in the manufacturing process, for example, the variation of the composition at the time of film formation in the wafer, it cannot be avoided that the light emission characteristics, such as light emission wavelength, of the LED element, which is obtained by separating the wafer into individual pieces, vary.

In the above-mentioned example, because the height of the resin packing unit which covers the LED element is set uniformly, the variation of the light emission wavelength in the individual LED elements is just reflected by the variation of the light emission characteristic of the LED package as a finished product, and as a result, defective products, whose characteristics deviate from the quality tolerance range, are forced to increase. Thus, in the related LED package manufacture technique, due to the variation of the light emission wavelength in the individual LED elements, there are problems that the light emission characteristic of the LED package as a finished product varies and that a yield loss occurs.

Thus, the object of the invention is to provide a resin coating device and a resin coating method so that in an LED package manufacturing system, even if the light emission wavelengths of individual LED elements vary, the light emission characteristics of LED packages are equalized and the yield can be improved.

Means for Solving the Problems

A resin coating device of the present invention provides with a resin coating device which is used in an LED package manufacturing system for manufacturing an LED package made by covering an LED element mounted on a board with a resin that includes fluorescent substance, and which coats the resin to cover the LED element mounted on the board, the resin coating device comprising:

a resin coating unit which discharges a variable coating quantity of the resin, and coats the resin at any coating positions;

a coating control unit which, by controlling the resin coating unit, makes a coating process for measurement in which the resin is test coated onto a light-passing member for light emission characteristic measurement, and a coating process for production in which the resin is coated onto the LED element for practical production to be performed;

a light-passing member carrying unit on which the light-passing member on which the resin is test coated in the coating process for measurement is carried;

a light source unit which is placed above the light-passing member carrying unit, and emits excitation light to excite the fluorescent substance;

a light emission characteristic measuring unit which receives from below the light-passing member the light that the resin emits when the excitation light is irradiated from above to the resin which is coated on the light-passing member, and measures the light emission characteristic of the light;

a coating quantity deriving processor which obtains the deviation between the measurement result of the light emission characteristic measuring unit and the light emission characteristic prescribed beforehand, and derives an appropriate resin coating quantity with which the resin should be coated onto the LED element as what is used for practical production based on the deviation; and a production performing processor which, by ordering the coating control unit with the appropriate resin coating quantity, makes the coating process for production in which the appropriate resin coating quantity of the resin is coated on the LED element to be performed.

A resin coating device of the present invention provides with a resin coating method which is used in an LED package manufacturing system for manufacturing an LED package which is made by covering an LED element mounted on a board with resin that includes fluorescent substance, and in which the resin is coated to cover the LED element mounted on the board, comprising a coating step for measurement in which the resin is test coated on a light-passing member for light emission characteristic measurement by a resin discharging unit which discharges a variable coating quantity of the resin;

a light-passing member carrying step in which the light-passing member on which the resin is test coated is carried on a light-passing member carrying unit;

an excitation light emitting step in which excitation light to excite the fluorescent substance is emitted from a light source unit which is placed above the light-passing member carrying unit, a light emission characteristic measuring step in which the light that the resin emits when the excitation light is irradiated from above to the resin which is coated on the light-passing member is received from below the light-passing member, and the light emission characteristic of the light is measured;

a coating quantity deriving step in which the deviation between the measurement result in the light emission characteristic measuring step and the light emission characteristic prescribed beforehand is obtained, and an appropriate resin coating quantity with which the resin should be coated onto the LED element as what is used for practical production is derived based on the deviation; and a production performing step in which, by ordering the coating control unit which controls the resin discharging unit with the derived appropriate resin coating quantity, the coating process for production in which the appropriate resin coating quantity of the resin is coated on the LED element is performed.

Effects of the Invention

According to the present invention, in the resin coating which is used in the manufacture of an LED package which is made by covering an LED element with resin that includes fluorescent substance, a light-passing member on which the resin is test coated for light emission characteristic measurement is carried on a light-passing member carrying unit, an light source unit, which is placed above, emits an excitation light which excites the fluorescent substance, and irradiates the excitation light from above to the resin which is coated on the light-passing member, a deviation between a measurement result obtained after the light emission characteristic of the light that the resin emits is measured and the light emission characteristic prescribed beforehand is obtained, and an appropriate resin coating quantity with which the resin should be coated on the LED element is derived for practical production based on the deviation. Thereby, even if the light emission wavelengths of individual LED elements vary, the light emission characteristics of LED packages are equalized and the yield can be improved.

BRIEF DESCRIPTION OF THE FIGURES

FIGS. 2(a) and 2(b) are construction illustrations of an LED package manufactured by the LED package manufacturing system of the embodiment of the present invention.

FIGS. 9(a) and 9(b) are illustrations of the construction and functions of a resin coating device in the LED package manufacturing system of the embodiment of the present invention.

FIGS. 14(a) to 14(c) are illustrations of threshold data for quality item determination in the LED package manufacturing system of the embodiment of the present invention.

FIGS. 17(a) to 17(d) are illustrations of the resin coating operation in the LED package manufacturing process of the LED package manufacturing system of the embodiment of the present invention.

EMBODIMENTS OF THE INVENTION

Figure 1:
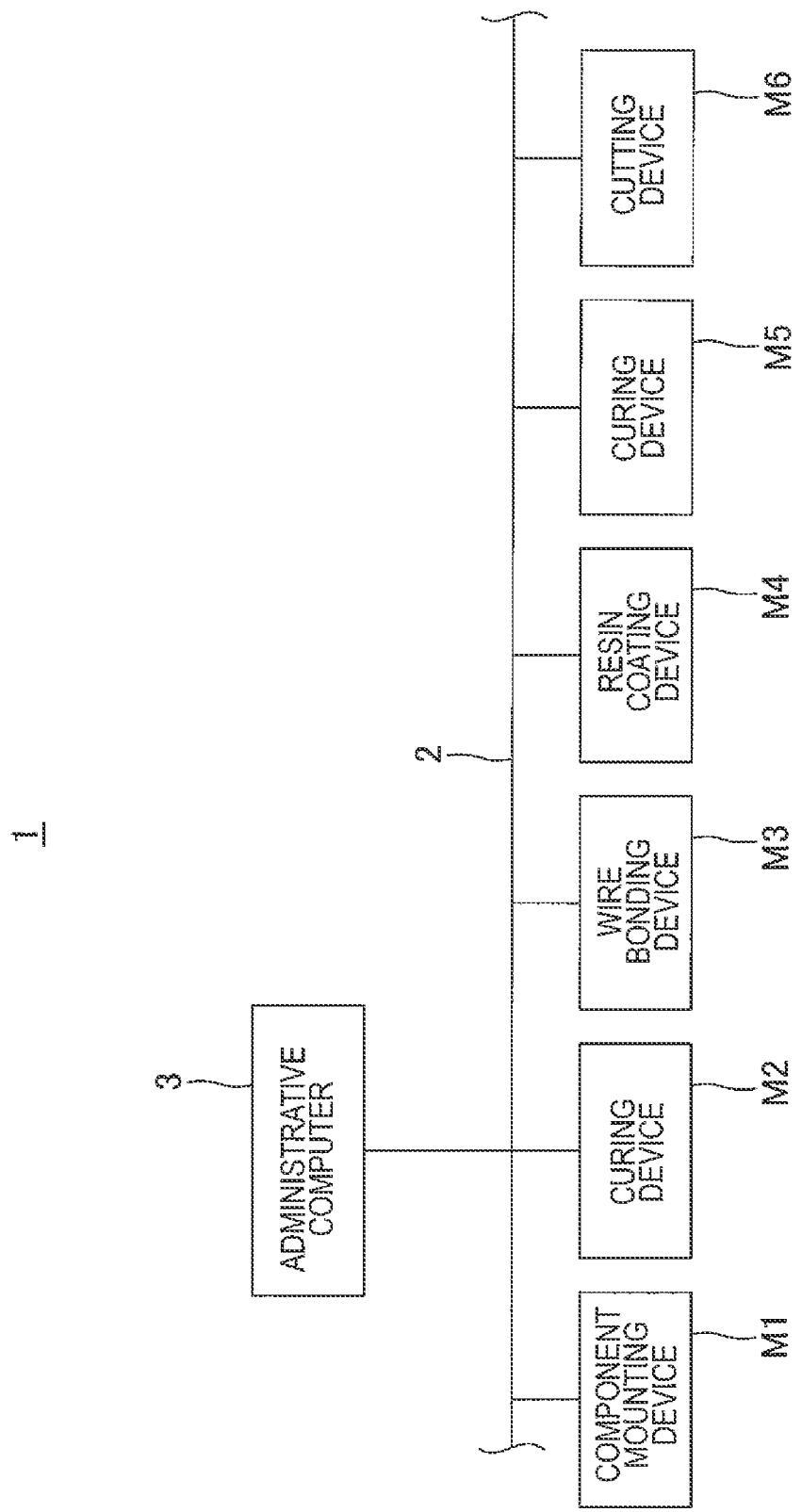
FIG. 1 is a block diagram which indicates the construction of an LED package manufacturing system of an embodiment of the present invention.
Figure 3:
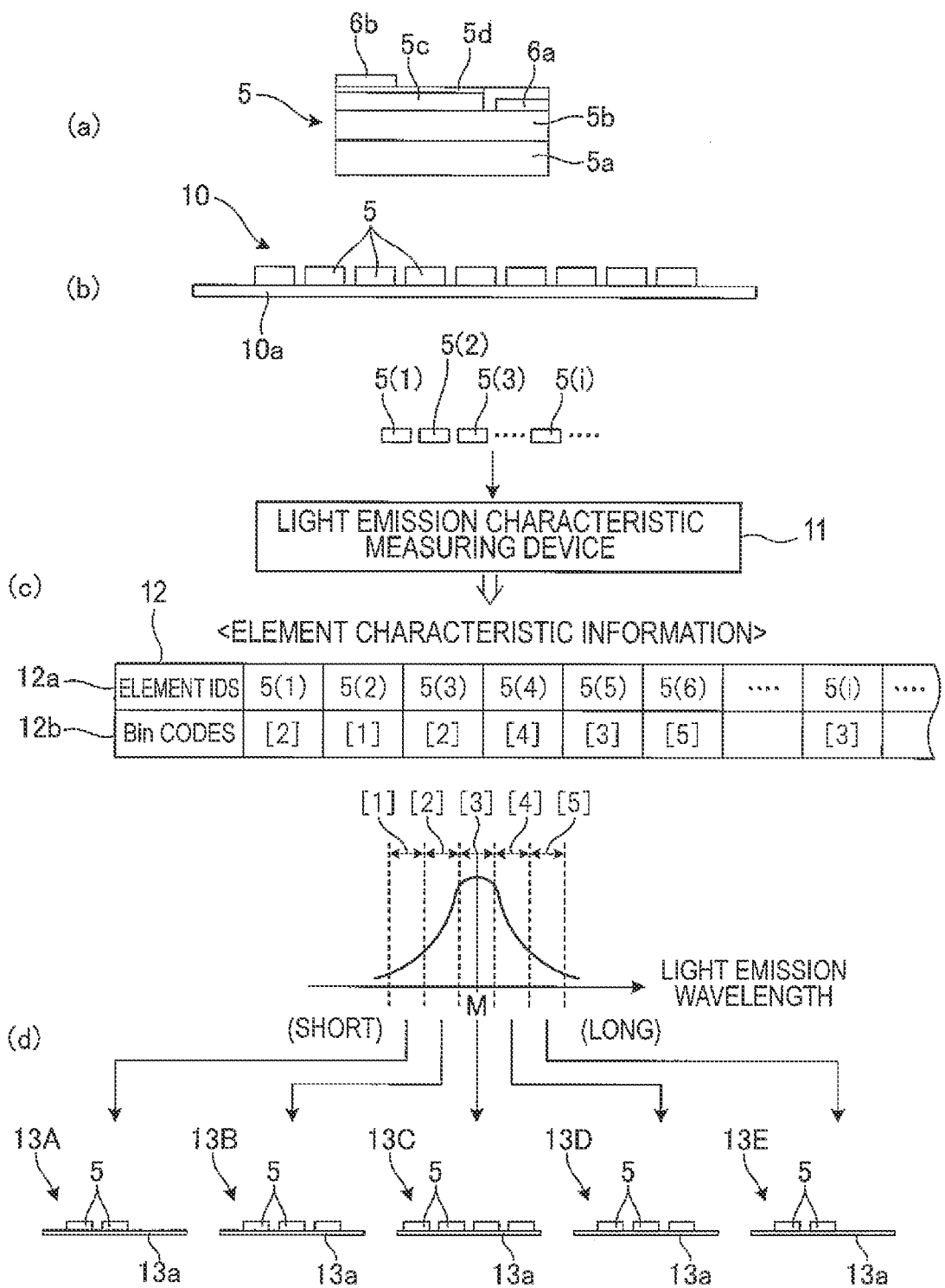
FIGS. 3(a) to 3(d) are illustrations of the supply form and the element characteristic information of LED elements used in the LED package manufacturing system of the embodiment of the present invention.

Next, an embodiment of the invention is described with reference to the figures. First, with reference to FIG. 1, the construction of an LED package manufacturing system 1 is described. The LED package manufacturing system 1 has a function of manufacturing an LED package which is made by covering an LED element which is mounted on a board with resin which includes fluorescent substance. In this embodiment, as shown in FIG. 1, the LED package manufacturing system 1 is so constructed that each of a component mounting device M1, a curing device M2, a wire bonding device M3, a resin coating device M4, a curing device M5, and a cutting device M6 is connected by a LAN system 2, and these devices are collectively controlled by an administrative computer 3.

The component mounting device M1 mounts LED elements 5 by bonding the LED elements 5 to a board 4 (refer to FIGS. 2(a) and 2(b)), which becomes a base of LED packages, with resin adhesive. The curing device M2 hardens the resin adhesive, which is used in the bonding at the time of the mounting, by heating the board 4 after the LED elements 5 are mounted. The wire bonding device M3 connects electrodes of the LED elements 5 to electrodes of the board 4 with bonding wires. The resin coating device M4 coats resin including fluorescent substance on each of the LED elements 5 on the board 4 after the wire bonding. The curing device M5 hardens the resin, which is coated to cover the LED elements 5, by heating the board 4 after the resin coating. The cutting device M6 cuts the board 4 after the resin is hardened for each of the LED elements 5 to separate into individual LED packages. Thereby, the LED packages which are separated into individual pieces are completed.

In FIG. 1, an example in which the devices from the component mounting device M1 to the cutting device M6 are placed in a line to construct a manufacturing line is shown. However, the LED package manufacturing system 1 does not necessarily adopt such a line construction, but may be so constructed that each of the steps is sequentially performed by the devices that are dispersedly placed, as far as the communication to be described in the following discussion is suitably performed. It is also possible to place a plasma processing device which performs a plasma processing for the purpose of cleaning electrodes prior to the wire bonding, and a plasma processing device which performs a plasma processing for the purpose of surface reforming to improve coherency of the resin after the wire bonding and prior to the resin coating, before and after the wire bonding device M3.

With reference to FIGS. 2(a) to 3(d), the board 4, on which operations are performed, the LED elements 5 and an LED package 50 as a finished product in the LED package manufacturing system 1, are described. As shown in FIG. 2(a), the board 4 is a multiple-pieces-connected board in which a plurality of individual boards 4a, each of which becomes the base of one LED package 50 in a finished product, are elaborated, and one LED mounting unit 4b where the LED element 5 is mounted, is formed on each of the individual boards 4a. The LED package 50 shown in FIG. 2(b) is completed by mounting the LED element 5 in the LED mounting unit 4b for each of the individual boards 4a, then coating resin 8 in the LED mounting unit 4b to cover the LED element 5, and, after hardening of the resin 8, cutting the board 4, whose steps have been completed, for each of the individual boards 4a.

The LED package 50 has a function of irradiate white light used as light sources of various illuminating devices, and is adapted to obtain quasi-white light by combining the LED element 5 which is a blue LED with the resin 8 which includes fluorescent substance that emits yellow fluorescence which is a complementary color to blue. As shown in FIG. 2(b), the individual board 4a is provided with a reflective unit 4c of a cavity shape which has, for example, a circular or an elliptic ring-like bank to form the LED mounting unit 4b. An N type unit electrode 6a and a P type unit electrode 6b of the LED element 5 which is loaded inside the reflective unit 4c are connected to wiring layers 4e and 4d which are formed on the top surface of the individual board 4a with bonding wires 7, respectively. The resin 8 covers the LED element 5 in this state and is coated at a predetermined thickness inside the reflective unit 4c, its and the blue light that is emitted from the LED element 5, in the process of passing through the resin 8, mixes with the yellow light emitted by the fluorescent substance included in the resin 8 and is irradiated as white light.

As shown in FIG. 3(a), the LED element 5 is constructed by laminating a n-type semiconductor 5b and a p-type semiconductor 5c on a sapphire board 5a and covering the surface of the p-type semiconductor 5c with a transparent electrode 5d and the N type unit electrode 6a and the P type unit electrode 6b for external connections are formed on the n-type semiconductor 5b and the p-type semiconductor 5c, respectively. As shown in FIG. 3(b), after a plurality of LED elements are formed collectively, the LED elements 5 are taken out from an LED wafer 10 which is attached and held onto a holding sheet 10a when the LED elements are separated into individual pieces. Due to various kinds of deviation factors in the manufacturing process, for example, the variation of the composition at the time of film formation in the wafer, it cannot be avoided that the light emission characteristics, such as light emission wavelength, of the LED elements 5, which are obtained by separating the wafer into individual pieces, vary. When such LED elements 5 are mounted onto the board 4 as they are, the light emission characteristics of LED packages 50 as final products vary.

To prevent the inferior quality due to the variation of the light emission characteristics, in the present embodiment, the light emission characteristics of a plurality of LED elements 5 manufactured with the same manufacturing process are measured beforehand, element characteristic information that makes each of the LED elements 5 to correspond to data indicating the light emission characteristic of the LED element 5 is prepared, and an appropriate quantity of resin 8 that corresponds to the light emission characteristic of the LED element 5 is coated in the coating of the resin 8. To coat the appropriate quantity of resin 8, the resin coating information to be described below is prepared beforehand.

First, the element characteristic information is described. As shown in FIG. 3(c), the LED elements 5 taken out from the LED wafer 10 are given element IDs to identify the individual pieces (here, the individual LED elements 5 are identified with consecutive numbers (i) in the LED wafer 10), and then cast into a light emission characteristic measuring device 11 sequentially. It is also possible that other forms of data, for example matrix coordinates indicating the arrangement of the LED elements 5 in the LED wafer 10 may be just used as the element IDs as long as they are information with which the LED elements 5 can be identified individually. By using such form of element IDs, it becomes possible to supply the LED elements 5 in the state of the LED wafer 10 in the component mounting device M1 to be described below.

The light emission characteristic measuring device 11 performs measurements in terms of predetermined items such as light emission wavelength or light emission strength, by supplying electricity to each of the LED elements 5 through a probe to make the LED elements 5 really emit light and making a spectroscopic analysis for the light. Regarding the LED elements 5 which are measured, a standard distribution of light emission wavelength is prepared beforehand as reference data, and by dividing a wavelength range that corresponds to the standard range in the distribution into a plurality of wavelength areas, the measured plurality of LED elements 5 are divided to be ranked by light emission wavelength. Herein, in response to each of the ranks that are set by dividing the wavelength range into five, Bin codes [1], [2], [3], [4] and [5] are given sequentially from the side of low wavelength. The element characteristic information 12 which has such a data structure that makes the Bin codes 12b correspond to the element IDs 12a is made.

That is, the element characteristic information 12 is information that is obtained by measuring light emission characteristics including light emission wavelength of the plurality of LED elements 5 individually beforehand, is prepared beforehand by the LED element manufacturer or the like and is transmitted to the LED package manufacturing system 1. The element characteristic information 12 may be transmitted by being recorded in an independent storage medium, or may be transmitted to the administrative computer 3 through the LAN system 2. In either case, the transmitted element characteristic information 12 is stored in the administrative computer 3, and is provided to the component mounting device M1 as needed.

In this way, the plurality of LED elements 5, whose light emission characteristic measurements are finished, are sorted by characteristic rank as shown in FIG. 3(d), divided into five kinds corresponding to each of the characteristic ranks, and attached onto five adhesion sheets 13a individually. Thereby, three kinds of LED sheets 13A, 13B, 13C, 13D and 13E in which LED elements 5 corresponding to either of the Bin codes [1], [2], [3], [4] and [5] are attached onto and held on the adhesion sheets 13a are made. When these LED elements 5 are mounted on the individual boards 4a of the board 4, the LED elements 5 are supplied to the component mounting device M1 in the form of the LED sheets 13A, 13B, 13C, 13D and 13E in which the LED elements 5 have been divided and ranked as above. At this time, the element characteristic information 12 is provided from the administrative computer 3 to the LED sheets 13A, 13B, 13C, 13D and 13E respectively in a form show that the LED elements 5 are held to correspond to either of the Bin codes [1], [2], [3], [4] and [5].

Figure 4:
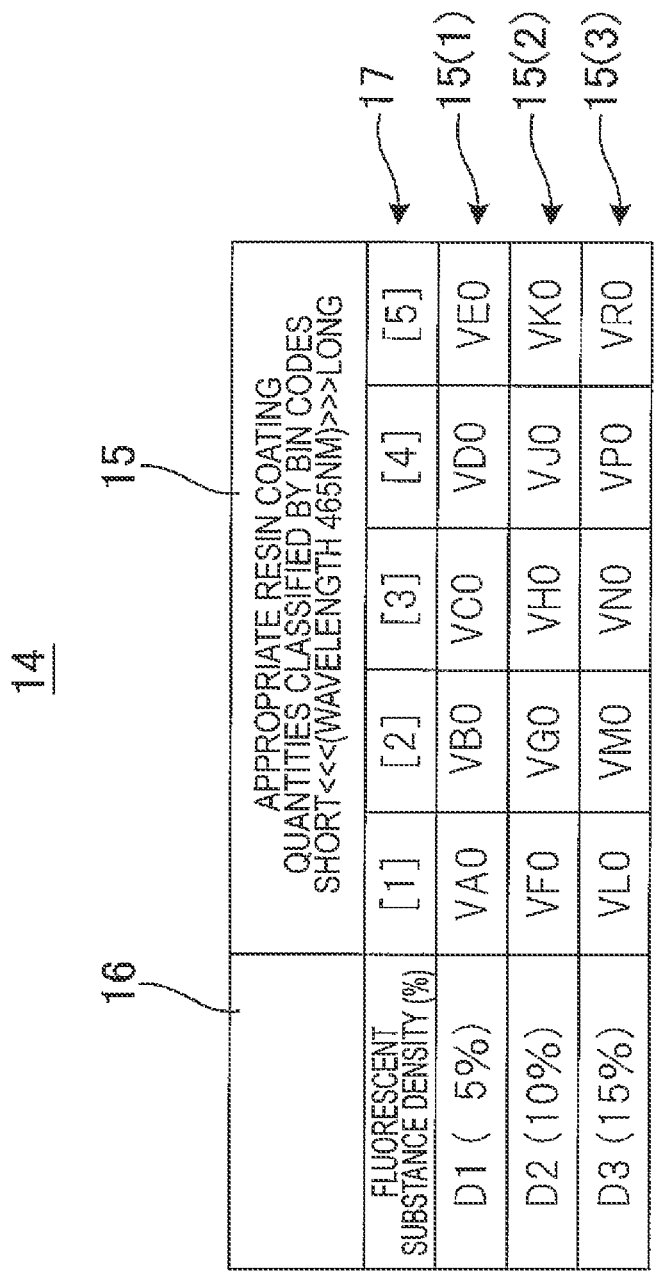
FIG. 4 is an illustration of resin coating information used in LED package manufacturing system of the embodiment of the present invention.

Then, the resin coating information prepared beforehand in response to the above-mentioned element characteristic information 12 is described with reference to FIG. 4. In the LED package 50 of the construction to obtain white light by combining a YAG-related fluorescent substance with a blue LED, because the blue light that the LED element 5 emits is added and mixed with the yellow light that the fluorescent substance emits by being excited by the blue light, the quantity of the fluorescent substance particles in the concave LED mounting unit 4b where the LED element 5 is mounted becomes an important factor in ensuring a normal light emission characteristic of the finished LED package 50.

As mentioned above, because there are variations classified by the Bin codes [1], [2], [3], [4] and [5] in the light emission wavelengths of a plurality of LED elements 5 which become operation objects at the same time, the appropriate quantities of the fluorescent substance particles in the resin 8 which is coated to cover the LED elements 5 differ based on the Bin codes [1], [2], [3], [4] and [5]. In this embodiment, in the prepared resin coating information 14, as shown in FIG. 4, appropriate resin coating quantities, classified based on the Bin codes, of the resin 8 which makes YAG-related fluorescent substance particles to be included in, for example, silicone resin or epoxy resin are prescribed in nl (nano-liters) beforehand based on Bin code divisions 17. That is, when only an appropriate resin coating quantity, shown in the resin coating information 14, of the resin 8 is coated precisely to cover the LED element 5, the quantity of fluorescent substance particles in the resin covering the LED element 5 become an appropriate supply quantity of fluorescent substance particles, and thereby the normal light emission wavelength that is demanded is ensured in the finished product after the resin is thermally cured.

Herein, as shown in a fluorescent substance density column 16, a plurality of fluorescent substance densities (herein, three densities, or D1 (5%), D2 (10%) and D3 (15%)) indicating the density of fluorescent substance particles of the resin 8 are set, and the appropriate resin coating quantities of the resin 8 are set so that appropriate numerical values (incompatibility in expression) are used based on the fluorescent substance densities of the used resin 8. That is, when the resin of the fluorescent substance density D1 is coated, for the Bin codes [1], [2], [3], [4] and [5], the resin 8 of appropriate resin coating quantities VA0, VB0, VC0, VD0 and VE0 (appropriate resin coating quantities 15(1)) are coated respectively. Likewise, when the resin of the fluorescent substance density D2 is coated, for the Bin codes [1], [2], [3], [4] and [5], the resin 8 of appropriate resin coating quantities VF0, VG0, VH0, VJ0 and VK0 (appropriate resin coating quantities 15(2)) are coated respectively. Further, when the resin of the fluorescent substance density D3 is coated, for the Bin codes [1], [2], [3], [4] and [5], the resin 8 of appropriate resin coating quantities VL0, VM0, VN0, VP0 and VR0 (appropriate resin coating quantities 15(3)) are coated respectively. In this way, the respective appropriate resin coating quantities are set for each of the plurality of fluorescent substance densities which are different. This is because coating the resin 8 of the most suitable fluorescent substance density based on the degree of the variation of the light emission wavelength is preferable for ensuring quality.

Figure 5:
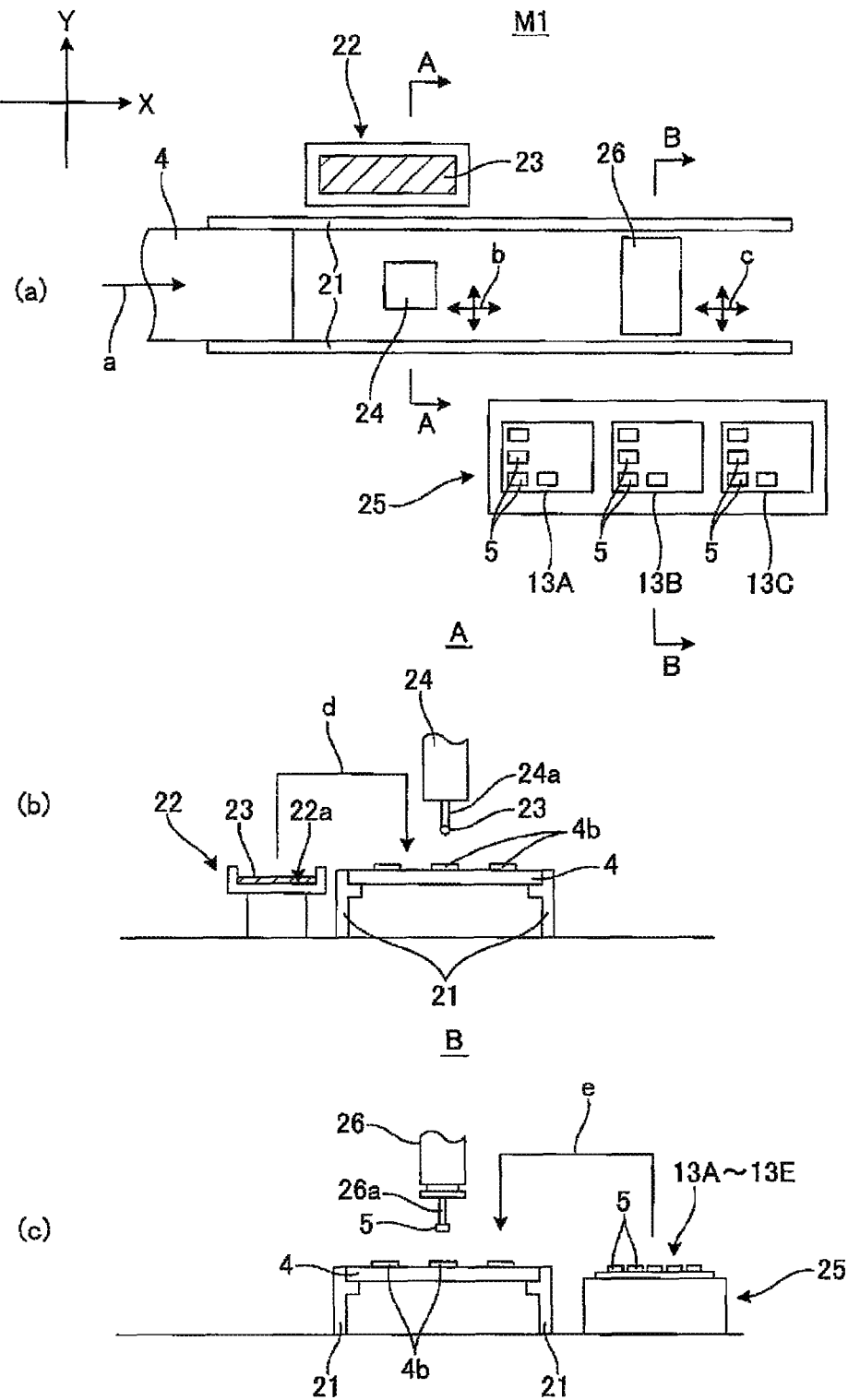
FIGS. 5(a) to 5(c) are illustrations of the construction and functions of a component mounting device in the LED package manufacturing system of the embodiment of the present invention.

Next, with reference to FIGS. 5(a) to 5(c), a construction and functions of the component mounting device M1 are described. As shown in the top view of FIG. 5(a), the component mounting device M1 includes a board conveying mechanism 21 which conveys a board 4, which is an operation object, supplied from upstream towards the board conveying direction (arrow a). To the board conveying mechanism 21, an adhesive coating unit A shown in FIG. 5(b) with an A-A section, and a component mounting unit B shown in FIG. 4(c) with a B-B section are disposed sequentially from upstream. The adhesive coating unit A includes an adhesive supply unit 22 which is placed beside the board conveying mechanism 21, and which supply resin adhesive 23 in the form of a coating of a predetermined film thickness, and an adhesive transferring mechanism 24 which is movable in the horizontal direction (arrow b) above the board conveying mechanism 21 and the adhesive supply unit 22. The component mounting unit B includes a component supply mechanism 25 which is placed beside the board conveying mechanism 21 and which holds the LED sheets 13A, 13B, 13C, 13D and 13E shown in FIG. 3(d), and a component mounting mechanism 26 which is movable in the horizontal direction (arrow c) above the board conveying mechanism 21 and the component supply mechanism 25.

As shown in FIG. 5(b), the board 4 imported into the board conveying mechanism 21 is positioned in the adhesive coating unit A, and the resin adhesive 23 is coated on the LED mounting unit 4b formed on each of the individual boards 4a. That is, first, by moving the adhesive transferring mechanism 24 to be above the adhesive supply unit 22, a transferring pin 24a is made to touch a coating of the resin adhesive 23 formed on a transferring surface 22a, and the resin adhesive 23 is attached. Then, by moving the adhesive transferring mechanism 24 to be above the board 4, and dropping the transferring pin 24a to the LED mounting unit 4b (arrow d), the resin adhesive 23 which is attached to the transferring pin 24a is supplied to an element mounting position in the LED mounting unit 4b with the transferring.

Then, the board 4 after the adhesive is coated is conveyed downstream and is positioned in the component mounting unit B as shown in FIG. 5(c), and an LED element 5 is mounted on each of the LED mounting units 4b after the adhesive is supplied. That is, first, by moving the component mounting mechanism 26 to be above the component supply mechanism 25, and dropping a mounting nozzle 26a relative to either of the LED sheets 13A, 13B, 13C, 13D and 13E which are held on the component supply mechanism 25, and an LED element 5 is held and taken out by the mounting nozzle 26a. Then, by moving the component mounting mechanism 26 to be above the LED mounting unit 4b of the board 4, and dropping the mounting nozzle 26a (arrow e) the LED element 5 held in the mounting nozzle 26a is mounted to the element mounting position where the adhesive is coated in the LED mounting unit 4b.

When the LED elements are mounted on the board 4 by the component mounting device M1, an element mounting program made beforehand, namely, the order in which the LED elements 5 are taken out from either of the LED sheets 13A, 13B, 13C, 13D and 13E and mounted on the plurality of individual boards 4a of the board 4 in individual mounting operations of the component mounting mechanism 26 is set beforehand, and component mounting operations are performed according to the element mounting program.

When the component mounting operations are performed, mounting position information 71a (refer to FIG. 11) which indicates which of the plurality of individual board 4a of the board 4 an individual LED element 5 is mounted onto is extracted from an operation performing history and recorded. Data which associate the element characteristic information 12, which indicates which characteristic rank (the Bin codes [1], [2], [3], [4] and [5]) the LED elements 5 mounted onto the individual boards 4a correspond to, with the mounting position information 71a are made as map data 18 shown in FIG. 6 by a map making processor 74 (refer to FIG. 11).

Figure 6:
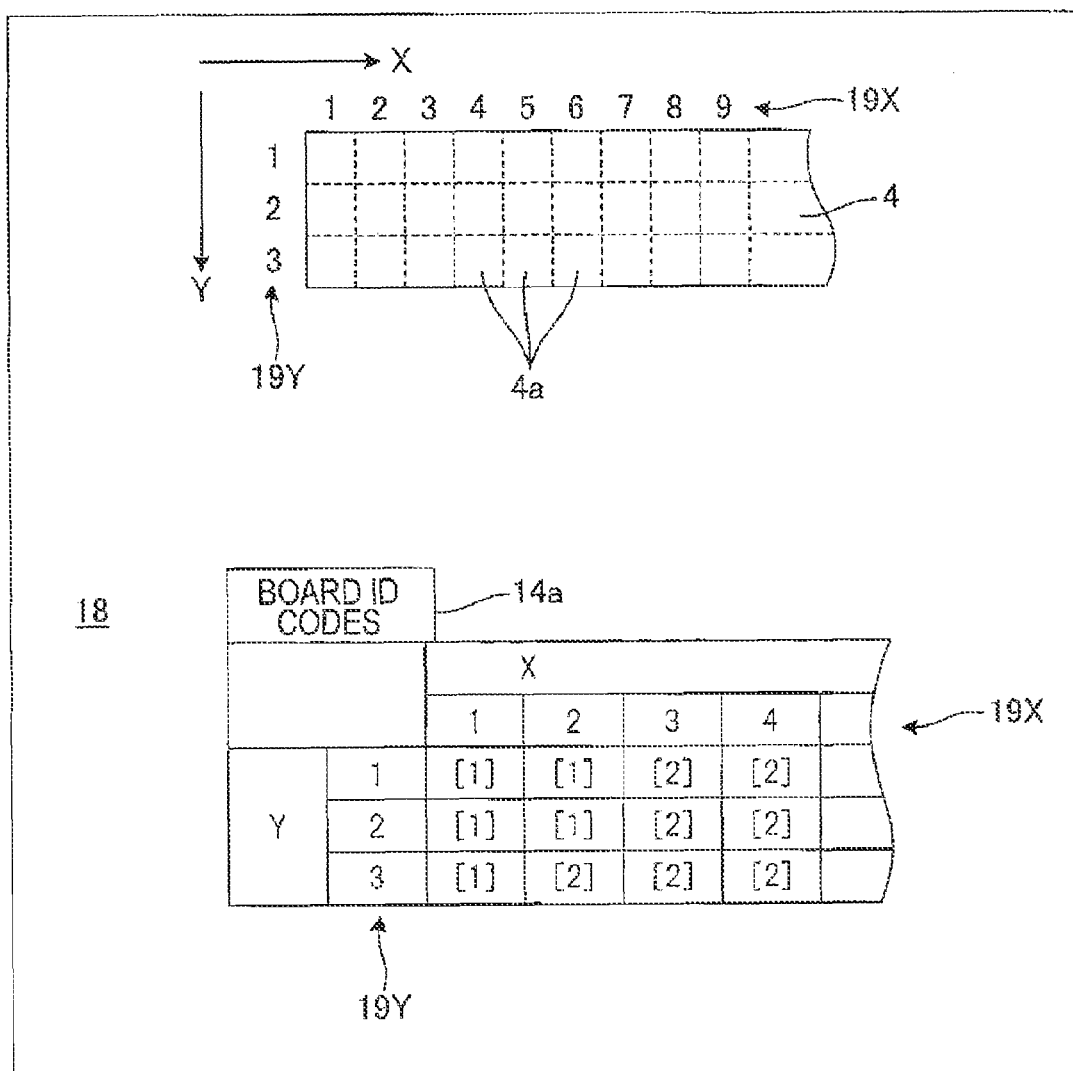
FIG. 6 is an illustration of map data used in the LED package manufacturing system of the embodiment of the present invention.

In FIG. 6, the individual positions of the plurality of individual boards 4a of the board 4 are specified by combining matrix coordinates 19X and 19Y which indicate the positions in the X direction and in the Y direction, respectively. By making the Bin code which an LED element 5 mounted at an position is classified into to correspond to the individual matrix cell of the matrix coordinates 19X and 19Y of the position, the map data 18 which associate the mounting position information 71a, which indicates the positions in the board 4 of the LED elements 5 mounted by the component mounting device M1, and the element characteristic information 12 of the LED elements 5 are made.

That is, the component mounting device M1 is constructed by including the map making processor 74 as a map data making means which makes the map data 18, which associate the mounting position information, which indicates the positions in the board 4 of the LED elements 5 mounted by the component mounting device M1, and the element characteristic information 12 of the LED elements 5, for each board 4. The made map data 18 are transmitted to the resin coating device M4 described below as forward feeding data through the LAN system 2.

Next, with reference to FIGS. 7(a) to 8(c), a construction and functions of the resin coating device M4 are described. The resin coating device M4 has a function of coating the resin 8 to cover the plurality of LED elements 5 mounted on the board 4 by the component mounting device M1. As shown in the top view of FIG. 7(a), the resin coating device M4 is constructed by disposing a resin coating unit C shown in FIG. 7(b) in a C-C section to a board conveying mechanism 31 which conveys the board 4, which is an operation object and is supplied from upstream to the board conveying direction (arrow f). The resin coating unit C is provided with a resin discharging head 32 which is constructed to discharge the resin 8 from a discharging nozzle 33a which is mounted at the lower end.

As shown in FIG. 7(b), the resin discharging head 32 is driven by the nozzle moving mechanism 34, and is moved in the horizontal directions (arrows g shown in FIG. 7(a)) and up and down when the nozzle moving mechanism 34 is controlled by a coating control unit 36. The resin 8 is supplied to the resin discharging head 32 to be accommodated in a syringe which is installed in the dispenser 33. When an air pressure is applied in the dispenser 33 by the resin discharging mechanism 35, the resin 8 in the dispenser 33 is discharged through the discharging nozzle 33a and is coated in the LED mounting unit 4b formed on the board 4. At this time, since the resin discharging mechanism 35 is controlled by the coating control unit 36, the discharging quantity of the resin 8 can be arbitrarily controlled. That is, the resin coating unit C has functions of discharging a variable coating quantity of the resin 8, and coating the resin 8 at any coating positions. Besides the air pressure dispenser 33, various liquid discharging methods, such as a plunger method using a machine cylinder, or a screw pump method, can be adopted in the resin discharging mechanism 35.

Beside the board conveying mechanism 31, a testing and measuring unit 40 is placed in the movement range of the resin discharging head 32. The testing and measuring unit 40 has a function of determining whether the coating quantity of the resin 8 is appropriate before the coating operation for practical production of coating the resin 8 in the LED mounting units 4b of the board 4, by measuring the light emission characteristic of the resin 8 which is test coated. That is, an light emission characteristic when a light that a light source unit 45 for measurement emits is irradiated on a light-passing member 43 where the resin 8 is test coated by the resin coating unit C is measured by a light emission characteristic measuring unit which includes a spectroscope 42 and a light emission characteristic measuring processor 39. By comparing the measurement result with a threshold set beforehand, it is determined whether the set resin coating quantity prescribed in the resin coating information 14 shown in FIG. 4 is appropriate.

The composition and characteristic of the resin 8 including fluorescent substance particles are not necessarily stable, and even if the appropriate resin coating quantities are set in the resin coating information 14 beforehand, it cannot be avoided that the density and the resin viscosity of the fluorescent substance fluctuate over time. Therefore, even if the resin 8 is discharged according to discharging parameters corresponding to the appropriate resin coating quantities set beforehand, it is possible that the resin coating quantity itself varies from the set appropriate value, or the resin coating quantity itself is appropriate but the supplied quantity of the fluorescent substance particles varies from what should be originally supplied due to density change.

In order to solve these problems, in the embodiment, a test coating for the purpose of checking whether an appropriate supply quantity of fluorescent substance particles are supplied in a predetermined interval is performed by the resin coating device M4. By performing the measurement of the light emission characteristic of the resin which is test coated, the supply quantity of the fluorescent substance particles which meet the requirement of the original light emission characteristic is stabilized. Thus, the resin coating unit C included in the resin coating device M4 shown in the present embodiment has a function of performing a coating process for measurement in which the resin 8 is test coated on the light-passing member 43 for the above-mentioned light emission characteristic measurement, in addition to a coating process for production in which the resin 8 is coated on the LED element 5 which is mounted on the board 4 for practical production. Either of the coating process for measurement and the coating process for production is performed when the resin coating unit C is controlled by the coating control unit 36.

Figure 8:
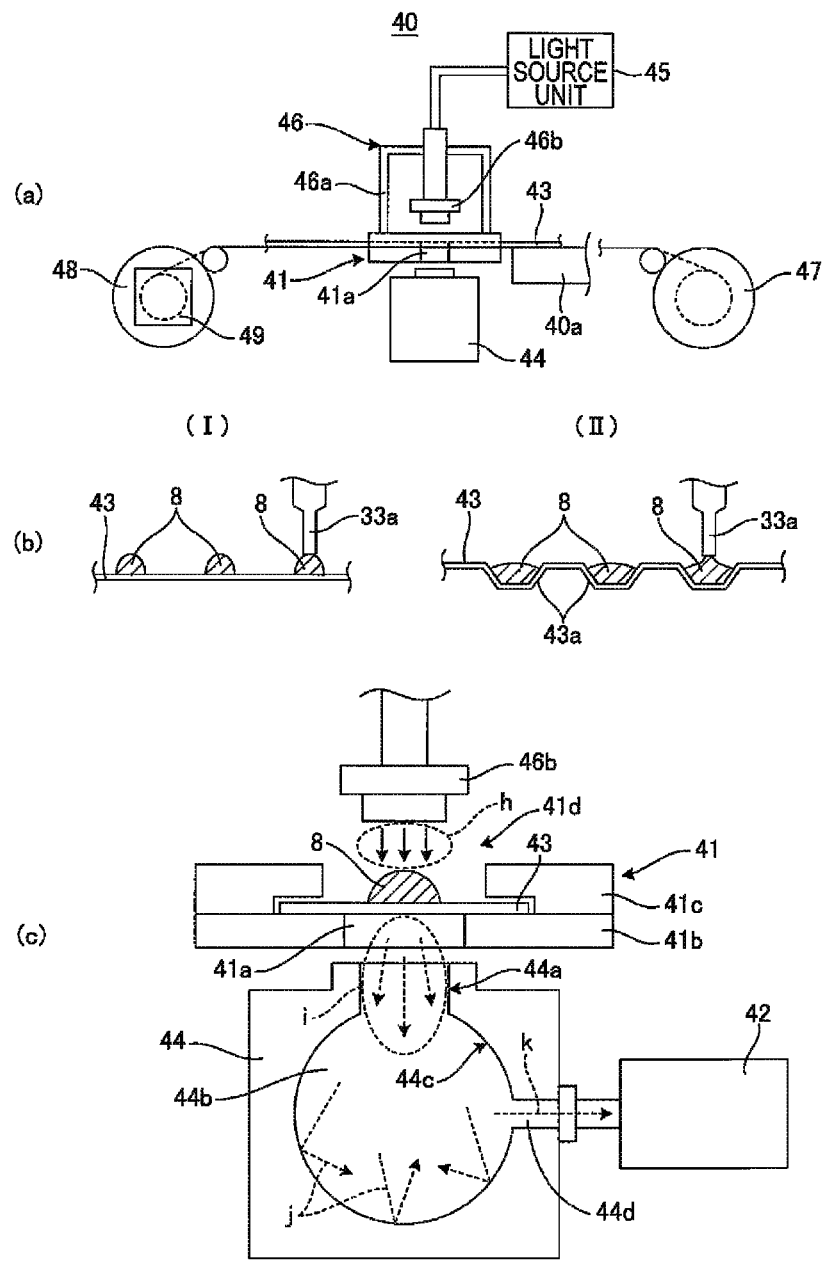
FIGS. 8(a) to 8(c) are illustrations of a light emission characteristic detecting function which is included in the resin coating device in the LED package manufacturing system of the embodiment of the present invention.

With reference to FIGS. 8(*a*) to 8(*c*), the detailed construction of the testing and measuring unit 40 is described. As shown in FIG. 8(*a*), the light-passing member 43 is supplied by being wound and accommodated in a supply reel 47. After the light-passing member 43 is sent along the top surface of a test stage 40*a*, the light-passing member 43 passes between a light-passing member carrying unit 41 and an irradiating unit 46, and is wound into a collecting reel 48 which is driven by a winding motor 49. Besides the collecting method of winding back into the collecting reel 48, various methods including a sending method in which the light-passing member 43 is sent into a collecting box by a sending mechanism can be adopted as a mechanism for collecting the light-passing member 43.

The irradiating unit 46 has a function of irradiating measurement light emitted by the light source unit 45 onto the light-passing member 43, and is constructed by disposing a light converging tool 46*b*, in which the measurement light which the light source unit 45 emits is guided by fiber cables, in a shading box 46*a* which has the function of a simple dark box. The light source unit 45 has a function of emitting an excitation light to excite the fluorescent substance included in the resin 8. In the present embodiment, the light source unit 45 is placed above the light-passing member carrying unit 41, and irradiates the measurement light to the light-passing member 43 from above through the light converging tool 46*b*.

Herein, tape material of a predetermined width formed of a planar sheet member of transparent resin, or the same tape material in which embossed units 43*a* which correspond to the recess shapes of the LED package 50 are protruded downwards from the bottom surface (emboss type), or the like are used to form the light-passing member 43 (refer to FIG. 8(*b*)). In the process of sending the light-passing member 43 on the testing and measuring unit 40, the resin 8 is test coated by the resin discharging head 32 onto the light-passing member 43. This test coating is performed as shown in FIG. 8(*b*), in which a prescribed coating quantity of the resin 8 is discharged by the discharging nozzle 33*a* to the light-passing member 43 which is supported by the test stage 40*a* from below.

(I) of FIG. 8(*b*) shows that the resin 8 of the set appropriate discharging quantity prescribed in the resin coating information 14 is coated onto the light-passing member 43 formed of the above-mentioned tape material. (II) of FIG. 8(*b*) shows that the resin 8 of the set appropriate discharging quantity is coated similarly in the embossed units 43*a* of the light-passing member 43 formed of the above-mentioned emboss type tape material. As described later, because the resin 8 which is coated on the test stage 40*a* is test coated to substantially determine whether the fluorescent substance supply quantity to the LED element 5 is appropriate, when the resin 8 is continually coated onto the light-passing member 43 at a plurality of points by the resin discharging head 32 with the same test coating movement, the coating is performed by making the coating quantities to be different progressively based on the known data indicating the correlation of light emission characteristic measurement and the coating quantity.

After the resin 8 is test coated in this way, white light emitted by the light source unit 45 is irradiated from above through the light converging tool 46*b* to the light-passing member 43 which is led in the shading box 46*a*. The light that passes the resin 8 which is coated on the light-passing member 43 is received by an integrating sphere 44, which is disposed below the light-passing member carrying unit 41, through a light-passing opening 41*a* which the light-passing member carrying unit 41 is provided with. FIG. 8(*c*) shows structures of the light-passing member carrying unit 41 and the integrating sphere 44. The light-passing member carrying unit 41 is so constructed that an upper guide member 41*c* having a function of guiding two end surfaces of the light-passing member 43 is installed on the top surface of a lower support member 41*b* which supports the under surface of the light-passing member 43.

The light-passing member carrying unit 41 has functions of guiding the light-passing member 43 at the time of conveying in the testing and measuring unit 40, and carrying and maintaining the position of the light-passing member 43 on which the resin 8 is test coated in the coating process for measurement. The integrating sphere 44 has functions of integrating the transmitted light which is irradiated from the light converging tool 46*b* (arrow h), and passes through the resin 8, and leading to the spectroscope 42. That is, the integrating sphere 44 has a spherical reflecting surface 44*c* inside, and the transmitted light (arrows i) which enters from an opening 44*a* located right under the light-passing opening 41*a* is incident in a reflection space 44*b* from the opening 44*a* which is provided at the top of the integrating sphere 44, leaves from an output unit 44*d* as measurement light (arrow k) in a process of repeating total reflection (arrows j) with the spherical reflecting surface 44*c*, and is received by the spectroscope 42.

In the above-mentioned construction, the white light emitted by the LED package used for the light source unit 45 is irradiated to the resin 8 which is test coated onto the light-passing member 43. In this process, the blue light component included in the white light excites the fluorescent substance in the resin 8 to emit yellow light. The white light in which this yellow light and the blue light are added and mixed is irradiated upwards from the resin 8, and is received by the spectroscope 42 through the above-mentioned integrating sphere 44.

Figure 7:
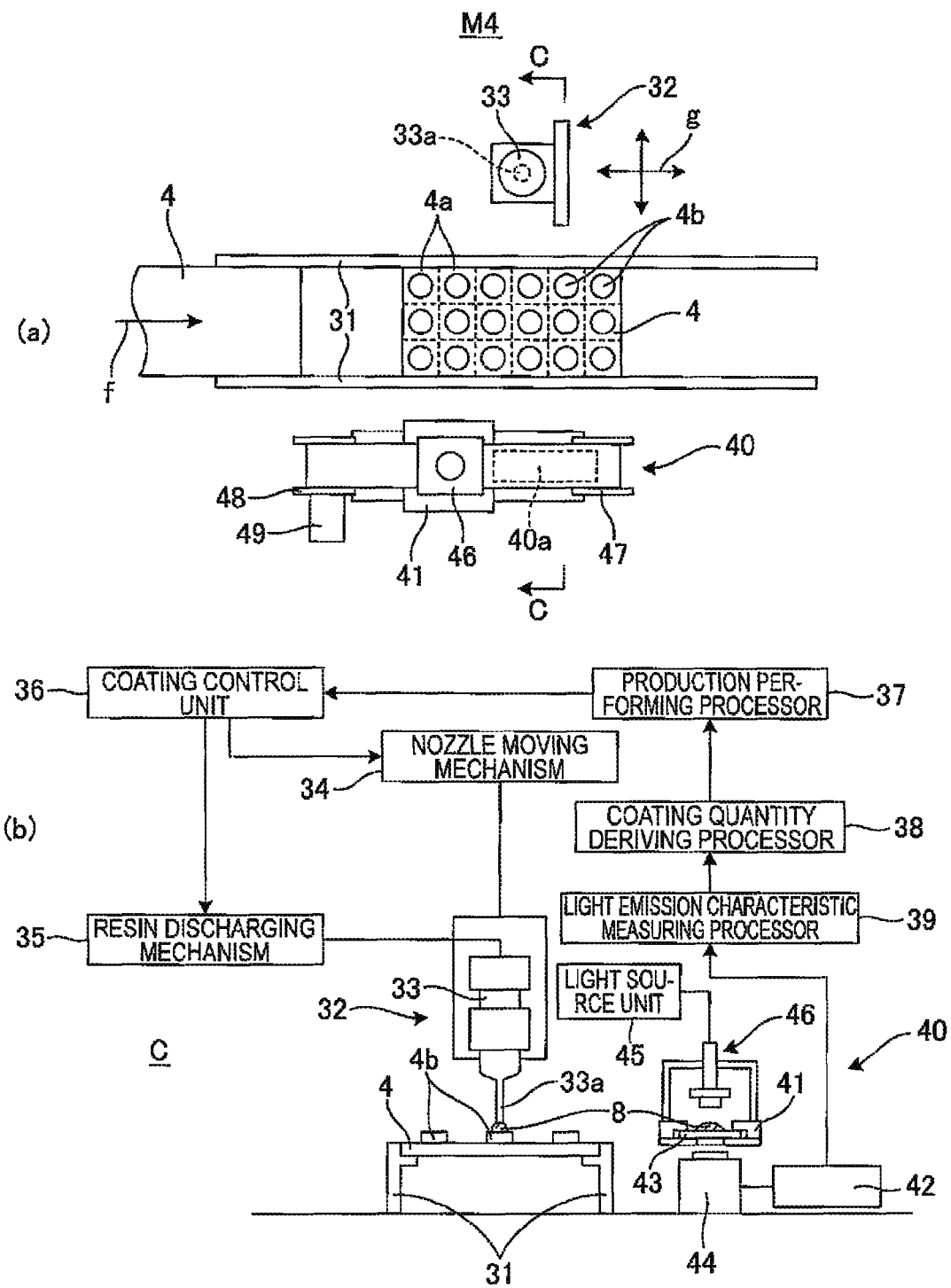
FIGS. 7(a) and 7(b) are illustrations of the construction and functions of a resin coating device in the LED package manufacturing system of the embodiment of the present invention.

As shown in FIG. 7(*b*), the received white light is analyzed by the light emission characteristic measuring processor 39, and the light emission characteristics are measured. Light emission characteristics such as color tone rank or beam of the white light are detected, and, as a result, deviations from prescribed light emission characteristics are detected out. The integrating sphere 44, the spectroscope 42 and the light emission characteristic measuring processor 39 constructs a light emission characteristic measuring unit which measures light emission characteristics of the light that the resin 8 emits when the excitation light (herein, white light emitted by a white LED) emitted by the light source unit 45 is irradiated from above to the resin 8 which is coated onto the light-passing member 43 by receiving the light that the resin 8 emits from below the light-passing member 43. In the present embodiment, the light emission characteristic measuring unit is constructed by placing the integrating sphere 44 below the light-passing member 43 so that the light that the resin 8 emits is received through the opening 44*a* of the integrating sphere 44.

The effects that are described below are obtained by constructing the light emission characteristic measuring unit as above. That is, for the coating shape of the resin 8 which is test coated onto the light-passing member 43 shown in FIG. 8(*b*), because the bottom side always contacts with the top surface of the light-passing member 43 or the bottom surfaces of the embossed units 43*a*, the bottom surface of the resin 8 always has a standard height that is prescribed by the light-passing member 43. Therefore, the height difference between the bottom surface of the resin 8 and the opening to 44*a* of the integrating sphere 44 is always kept constant. On the other hand, for the top surfaces of the resin 8, due to disturbance such as coating condition of the discharging nozzle 33a, the same liquid surface shape and height may not be necessarily realized, and the intervals between the top surfaces of the resin 8 and the light converging tool 46b will vary.

If the stability is considered by comparing the irradiation light irradiated to the top surfaces of the resin 8 and the transmitted light from the under surfaces of the resin 8, because the irradiation light irradiated to the resin 8 is irradiated through the light converging tool 46b, the convergence degree is high, and the influence that the variation in the intervals between the top surface of the resin 8 and the light converging tool 46b has on the light transmission can be ignored. On the other hand, because the transmitted light which passes through the resin 8 is the excited light because the fluorescent substance is excited inside the resin 8, the dispersion degree is high, and the influence that the variation in the distances between the under surfaces of the resin 8 and the opening 44a has on the degree to which light is taken in by the integrating sphere 44 cannot be ignored.

In the testing and measuring unit 40 shown in the present embodiment, because such a construction is adopted that the Eight that the resin 8 emits when the excitation light emitted by the light source unit 45 as constructed above is irradiated from above to the resin 8 is received by the integrating sphere 44 from below the light-passing member 43, it is possible to determine stable light emission characteristics. By using the integrating sphere 44, it is not necessary to separately provide a darkroom structure in the light receiving unit, and it is possible to make the device compact and to reduce the device cost.

As shown in FIG. 7(b), the measurement result of the light emission characteristic measuring processor 39 is sent to a coating quantity deriving processor 38, and the coating quantity deriving processor 38 obtains the deviation between the measurement result of the light emission characteristic measuring processor 39 and a light emission characteristic prescribed beforehand, and derives the appropriate resin coating quantity of the resin 8 which should be coated onto the LED element 5 as what is used for practical production based on the deviation. The new appropriate discharging quantity derived by the coating quantity deriving processor 38 is sent to a production performing processor 37, and the production performing processor 37 orders the coating control unit 36 with the newly derived appropriate resin coating quantity. Thereby, the coating control unit 36 controls the nozzle roving mechanism 34 and the resin discharging mechanism 35 to make the resin discharging head 32 perform a coating process for production to coat the resin 8 of the appropriate resin coating quantity onto the LED element 5 that is mounted on the board 4.

In the coating process for production, first, the resin 8 of the appropriate resin coating quantity prescribed in the resin coating information 14 is really coated, and the light emission characteristic is measured when the resin 8 is in a non-hardened state. Based on the obtained measurement result, a quality item range of the light emission characteristic measurement value when the light emission characteristic of the resin 8 that is coated in the coating process for production is measured is set, and this quality item range is used as a threshold (refer to the threshold data 81a shown in FIG. 11) with which whether a quality item is obtained in the coating for production is determined.

That is, in the resin coating method in the LED package manufacturing system shown in the present embodiment, while a white LED is used as the light source unit 45 for the light emission characteristic measurement, the light emission characteristic that deviates from the normal light emission characteristic which is obtained from the finished product when the resin which is coated on the LED element 5 is in a hardened state for a light emission characteristic difference because the resin 8 is in an unhardened state is used as the light emission characteristic prescribed beforehand which is the basis of setting the threshold with which whether a quality item is obtained in the coating for production is determined. Thereby, the control of the resin coating quantity in the process of coating resin onto the LED element 5 can be performed based on the normal light emission characteristic on the finished product.

In the present embodiment, the LED package 50 which eras white light is used as the light source unit 45. Thereby, the light emission characteristic measurement of the test coated resin 8 can be performed with a light of the same characteristic as the excitation light emitted in the LED package 50 of the finished product, and a more reliable detection result can be obtained. It is not necessary to require using the same LED package 50 as what is used in a finished product. In the light emission characteristic measurement, a light source device which can stably emits blue light of a constant wavelength (for example, a blue LED or a blue laser light source which emit blue light) can be used as a light source unit for detection. However, by using the LED package 50 which emits white light using the blue LED, there is an advantage that a light source device of stable quality can be chosen at a low cost. It is also possible to take out blue light of a predetermined wavelength by using a band pass filter.

Figure 10:
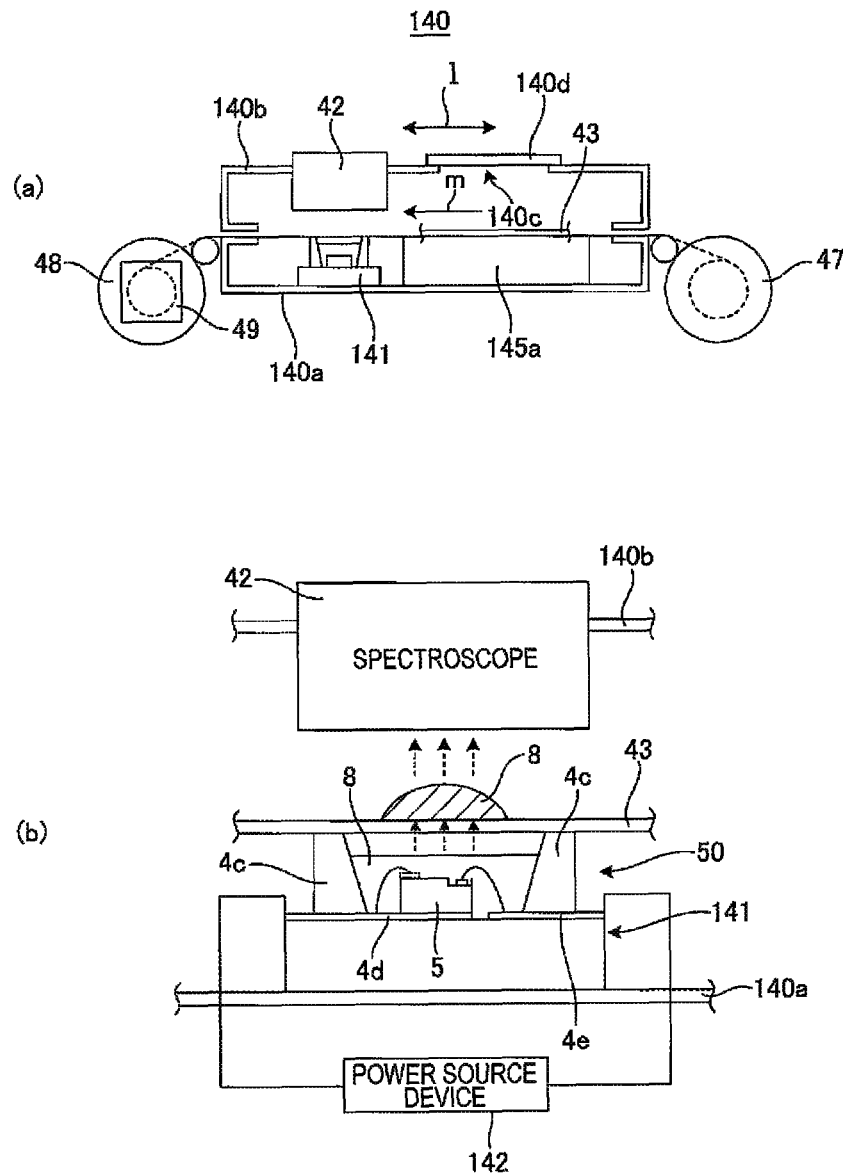
FIGS. 10(a) to 10(b) are illustrations of a light emission characteristic detecting function which is included in the resin coating device in the LED package manufacturing system of the embodiment of the present invention.

Instead of the testing and measuring unit 40 of the above-mentioned construction, a testing and measuring unit 140 of the construction shown in FIGS. 9(b) and 10(a) may be used. That is, as shown in FIGS. 9(b) and 10(a), the testing and measuring unit 140 has such an outside construction that a cover unit 140b is disposed above a horizontal base 140a of a slim shape. The cover unit 140b is provided with an opening 140c, and the opening 140c can be opened by a sliding window 140d which is used in coating and is slidable (arrow I). Inside the testing and measuring unit 140, a test stage 145a which supports the light-passing member 43 from below, a light-passing member carrying unit 141 which carries the light-passing member 43, and a spectroscope 42 which is disposed above the light-passing member carrying unit 141 are provided.

The light-passing member carrying unit 141 includes a light source device which emits excitation light to excite the fluorescent substance like the light source unit 45 shown in FIG. 8(a). The excitation light is irradiated from below by the light source device to the light-passing member 43 on which the resin 8 is test coated in a coating process for measurement. Like the example shown in FIG. 8(a), the light-passing member 43 is supplied by being wound and accommodated in the supply reel 47. After the light-passing member 43 is sent along the top surface of the test stage 145a (arrow m), the light-passing member 43 passes between the light-passing member carrying unit 141 and the spectroscope 42, and is wound into the collecting reel 48 which is driven by the winding motor 49.

In a state that the sliding window 140d used in coating is slid and threw open, the top surface of the test stage 145a is exposed upwards, it is possible for the resin discharging head 32 to test coat the resin 8 on the light-passing member 43 carried on the top surface. This test coating is performed as shown in FIG. 8(b), in which a prescribed coating quantity of the resin 8 is discharged by the discharging nozzle 33a to the light-passing member 43 which is supported by the test stage 145a from below.

FIG. 10(b) shows that by moving the light-passing member 43 on which the resin 8 is test coated on the test stage 145a, to make the resin 8 to be located above the light-passing member carrying unit 141, and dropping the cover unit 140b, a dark room for the light emission characteristic measurement is formed between the cover unit 141 and base 140a. The LED package 50 emitting white light is used as a light source device in the light-passing member carrying unit 141. In the LED package 50, wiring layers 4e and 4d connected to the LED element 5 is connected to a power source device 142. By switching ON the power source device 142, electricity for light emission is supplied to the LED element 5 and thereby the LED package 50 emits white light.

In the process that the white light is irradiated to the resin 8 test coated on the light-passing member 43 after the white light passes through the resin 8, a white light, in which yellow light that the fluorescent substance in the resin 8, which is excited by the blue light included in the white light, emits and the blue light are added and mixed, is irradiated upwards from the resin 8. The spectroscope 42 is placed above the testing and measuring unit 140. The its white light irradiated from the resin 8 is received by the spectroscope 42. The received white light is analyzed by the light emission characteristic measuring processor 39 to measure the light emission characteristic. Light emission characteristics such as color tone rank or beam of the white light are detected, and, as a result, deviations from prescribed light emission characteristics are detected out. That is, the light emission characteristic measuring processor 39 measures the light emission characteristic of the light that the resin 8 emits when the excitation light emitted from the LED element 5 which is the light source unit is irradiated to the resin 8 which is coated on the light-passing member 43. The measurement result of the light emission characteristic measuring processor 39 is sent to the coating quantity deriving processor 38, and the processes like the example shown in FIG. 7(b) are performed.

Figure 11:
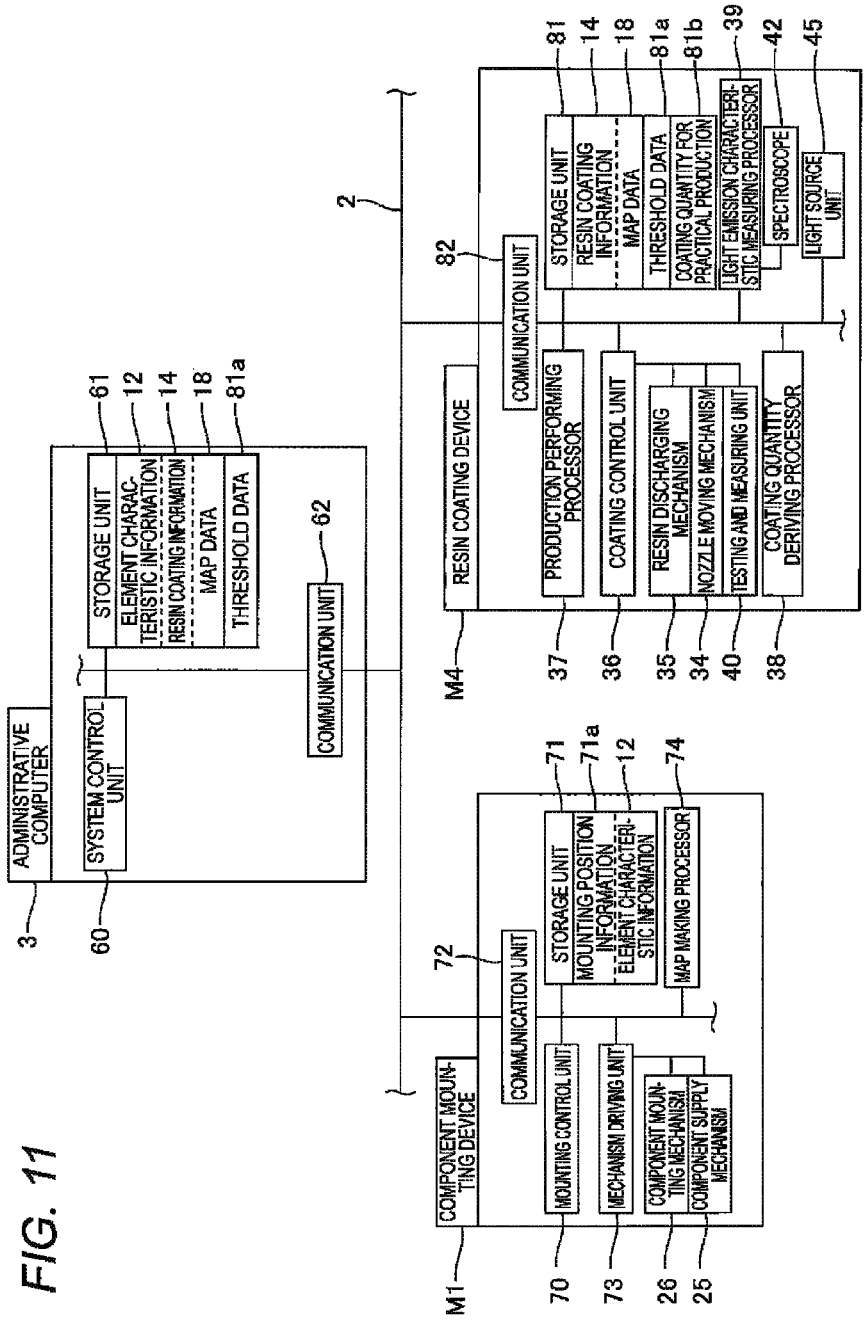
FIG. 11 is a block diagram which indicates the construction of a control system of the LED package manufacturing system of the embodiment of the present invention.

Next, with reference to FIG. 11, the construction of a control system of the LED package manufacturing system 1 is described. Among the component elements of the devices that construct the LED package manufacturing system 1, those component elements that are related to the element characteristic information 12, the resin coating information 14, the map data 18 and the transmission/reception and update processing of the above-mentioned threshold data 81a are shown in the administrative computer 3, the component mounting device M1 and the resin coating device M4.

In FIG. 11, the administrative computer 3 includes a system control unit 60, a storage unit 61 and a communication unit 62. The system control unit 60 collectively controls LED package manufacturing operation of the LED package manufacturing system 1. Besides programs and data necessary for control processes of the system control unit 60, the element characteristic information 12, the resin coating information 14, the map data 18 and threshold data 81a, as needed, are stored in the storage unit 61. The communication unit 62 is connected to other devices through the LAN system 2 and delivers control signals and data. The element characteristic information 12 and the resin coating information 14 are transmitted from outside through the LAN system 2 and the communication unit 62 or through an independent storage medium such as a CD ROM, a USB memory storage, or a SD card, and are stored in the storage unit 61.

The component mounting device M1 includes a mounting control unit 70, a storage unit 71, a communication unit 72, a mechanism driving unit 73 and a map making processor 74. The mounting control unit 70 controls all units described below based on various programs and data stored in the storage unit 71 to perform component mounting operations of the component mounting device M1. Besides programs and data necessary for the control processes of the mounting control unit 70, the mounting position information 71a and the element characteristic information 12 are stored in the storage unit 71. The mounting position information 71a is made of the historical data of the mounting operation control performed by the mounting control unit 70. The element characteristic information 12 is transmitted from the administrative computer 3 through the LAN system 2. The communication unit 72 is connected to other devices through the LAN system 2, and delivers control signals and data.

The mechanism driving unit 73 is controlled by the mounting control unit 70 and drives the component supply mechanism 25 and the component mounting mechanism 26. Thereby, the LED element 5 is mounted onto each of the individual boards 4a of the board 4. The map making processor 74 (map data making means) performs the process of making the map data 18 for every board 4 which associate the mounting position information 71a indicating the position in the board 4 of the LED element 5 mounted by the component mounting device M1 with the element characteristic information 12 on the LED element 5, both of which are stored in the storage unit 71. That is, the component mounting device M1 is provided with the map data making means, and the map data 18 are transmitted from the component mounting device M1 to the resin coating device M4. The map data 18 may be transmitted to the resin coating device M4 from the component mounting device M1 via the administrative computer 3. In this case, as shown in FIG. 11, the map data 18 are stored in the storage unit 61 of the administrative computer 3.

The resin coating device M4 includes the coating control unit 36, a storage unit 81, a communication unit 82, the production performing processor 37, the coating quantity deriving processor 38, and light emission characteristic measuring processor 39. The coating control unit 36, by controlling the nozzle moving mechanism 34, the resin discharging mechanism 35 and the testing and measuring unit 40 which construct the resin coating unit C, performs processes to make the coating process for measurement in which the resin 8 is test coated onto the light-passing member 43 used for light emission characteristic measurement, and the coating process for production in which the resin 8 is coated onto the LED element 5 for practical production to be performed.

Besides programs and data necessary for control processes of the coating control unit 36, the resin coating information 14, the map data 18, the threshold data 81a and coating quantity for practical production 81b are stored in the storage unit 81. The resin coating information 14 is transmitted from the administrative computer 3 through the LAN system 2, and the map data 18 are transmitted from the component mounting device M1 through the LAN system 2 similarly. The communication unit 82 is connected to other devices through the LAN system 2 and delivers control signals and data.

The light emission characteristic measuring processor 39 performs processes to measure the light emission characteristic of the light that the resin 8 emits when the excitation light emitted from the light source unit 45 is irradiated to the resin 8 which is coated on the light-passing member 43. The coating quantity deriving processor 38 performs calculating processes to obtain the deviation between the measurement result of the light emission characteristic measuring processor 39 and the light emission characteristic prescribed beforehand, and derive the appropriate resin coating quantity of the resin 8 which should be coated onto the LED element 5 as what is used for practical production based on the deviation. The production performing processor 37 makes the coating process for production, in which the resin of the appropriate resin coating quantity is coated on the LED element 5, to be performed, by ordering the coating control unit 36 with the appropriate resin coating quantity derived by the coating quantity deriving processor 38.

In the construction shown in FIG. 11, processing functions except those functions to perform the operations specific to the devices, for example, the function of the map making processor 74 which the component mounting device M1 is provided with and the function of the coating quantity deriving processor 38 which the resin coating device M4 are provided with, are not necessarily attached to the devices. For example, it is also possible that the functions of the map making processor 74 and the coating quantity deriving processor 38 may be covered by the calculation processing function that the system control unit 60 of the administrative computer 3 has, and necessary signal transmission and reception may be performed through the LAN system 2.

In the construction of the above-mentioned LED package manufacturing system 1, each of the component mounting device M1 and the resin coating device M4 are connected to the LAN system 2. The administrative computer 3 in which the element characteristic information 12 is stored in the storage unit 61 and the LAN system 2 become an element characteristic information providing means that provides the information that is obtained by measuring the light emission characteristic including the light emission wavelengths of a plurality of LED elements 5 individually beforehand, to the component mounting device M1 as the element characteristic information 12. Likewise, the administrative computer 3 in which the resin coating information 14 is stored in the storage unit 61 and the LAN system 2 become a resin information providing means that provides the information that makes the appropriate resin coating quantity of the resin 8 to obtain an LED package 50 that possesses the prescribed light emission characteristic to correspond to the element characteristic information to the resin coating device M4 as the resin coating information.

That is, the element characteristic information providing means which provides the element characteristic information 12 to the component mounting device M1 and the resin information providing means which provides the resin coating information 14 to the resin coating device M4 are constructed to transmit the element characteristic information and the resin coating information, which are read from the storage unit 61 of the administrative computer 3 that is an external storing means, to the component mounting device M1 and the resin coating device M4 through the LAN system 2, respectively.

Figure 12:
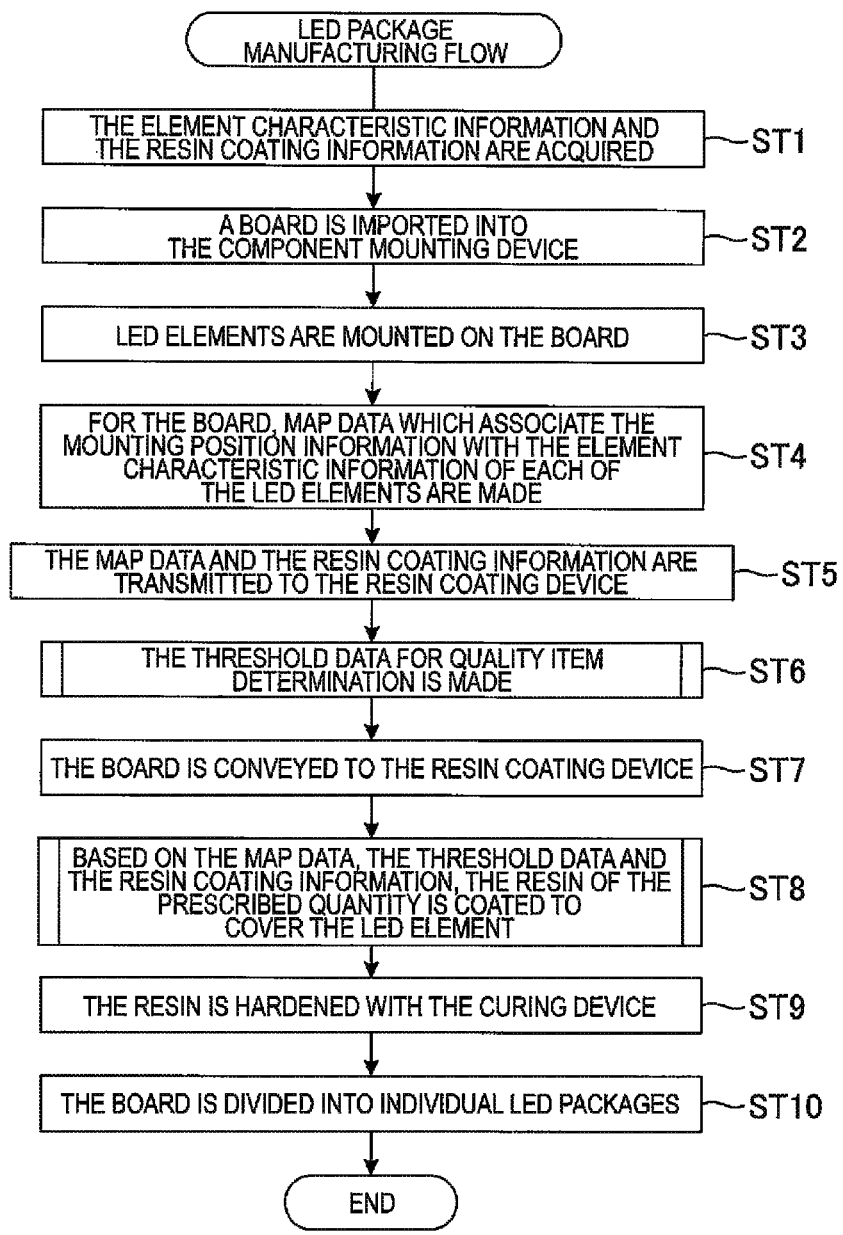
FIG. 12 is a flow diagram of manufacturing LED packages in the LED package manufacturing system of the embodiment of the present invention.

Next, LED package manufacturing processes performed by the LED package manufacturing system 1 are described with reference to the figures along a flow of FIG. 12. First, the element characteristic information 12 and the resin coating information 14 are acquired (ST1). That is, the element characteristic information 12 that is obtained by individually measuring light emission characteristics including the light emission wavelengths of a plurality of LED elements 5 beforehand and the resin coating information 14 that makes the appropriate resin coating quantity of the resin 8 to obtain an LED package 50 that possesses the prescribed light emission characteristic to correspond to the element characteristic information 12 are acquired through the LAN system 2 from an external device or through a storage medium.

After this, a board 4 on which the mounting is to be performed is imported into the component mounting device M1 (ST2). After the resin adhesive 23 has been supplied to the element mounting position in the LED mounting unit 4b by elevating the transferring pin 24a of the adhesive transferring mechanism 24 (arrow n), as shown in FIG. 18(a), the LED element 5 which is held in the mounting nozzle 26a of the component mounting mechanism 26 is dropped (arrow o) and mounted in the LED mounting unit 4b of the board 4 through the resin adhesive 23, as shown in FIG. 18(b) (ST3). From the data of the component mounting operations, the map data 18 for the board 4 which associate the mounting position information 71a with the element characteristic information 12 of each of the LED elements 5 are made by the map making processor 74 (ST4). Then, this map data 18 are transmitted to the resin coating device M4 from the component mounting device M1, and the resin coating information 14 is transmitted to the resin coating device M4 from the administrative computer 3 (ST5). Thereby, it becomes possible for the resin coating device M4 to perform resin coating operations.

Figure 18:
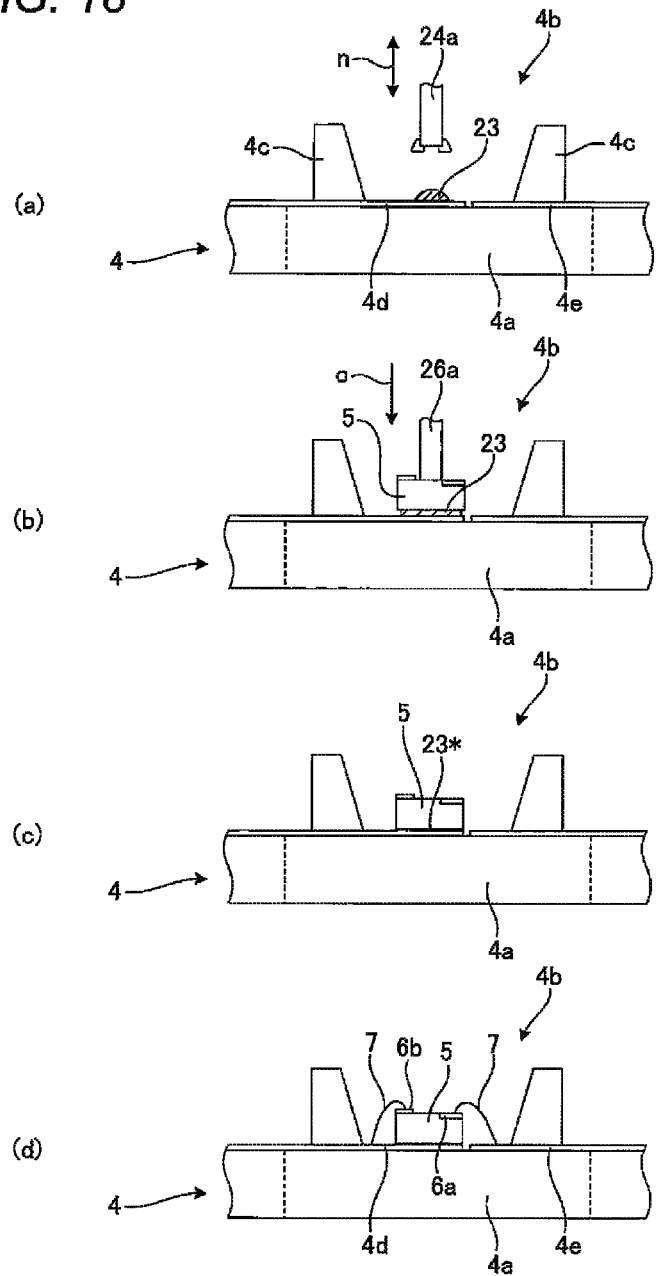
FIGS. 18(a) to 18(d) are step illustrations of the LED package manufacturing process of the LED package manufacturing system of the embodiment of the present invention.

Then, the board 4 after the component mounting is sent to the curing device M2 and heated there, as shown in FIG. 18(c), so that the resin adhesive 23 is thermally hardened and becomes resin adhesive 23* and the LED element 5 is adhered to the individual board 4a. Then, the board 4 after the resin curing is sent to the wire bonding device M3, and the wiring layers 4e and 4d of the individual board 4a are connected to the N type unit electrode 6a and the P type unit electrode 6b of the LED element 5 with bonding wires 7, respectively, as shown in FIG. 18 (d).

Figure 13:
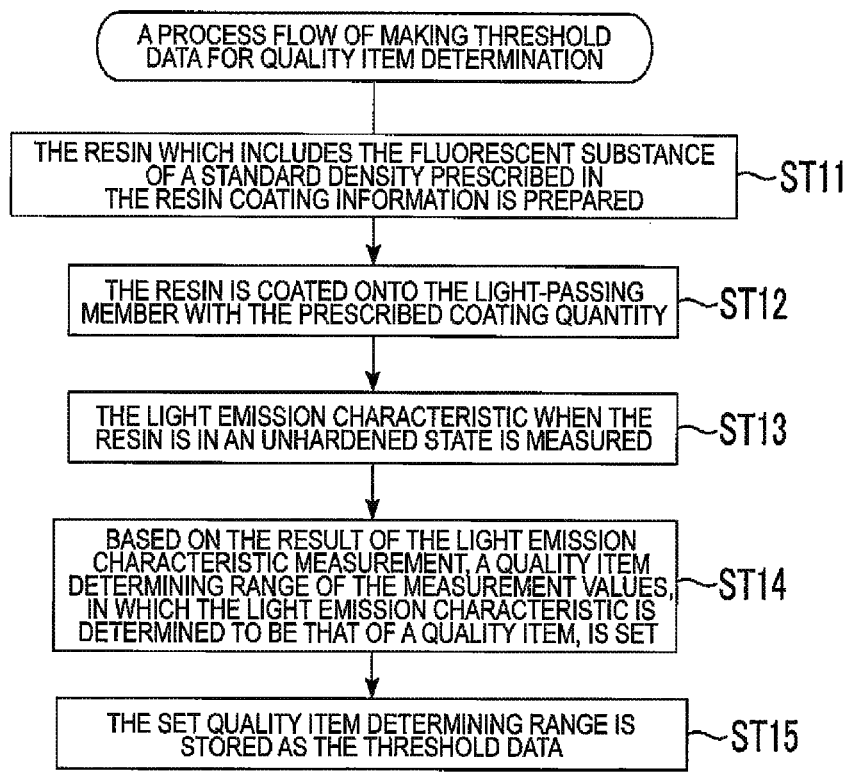
FIG. 13 is a flow diagram of a threshold data making process for quality item determination in the LED package manufacturing system of the embodiment of the present invention.
Figure 15:
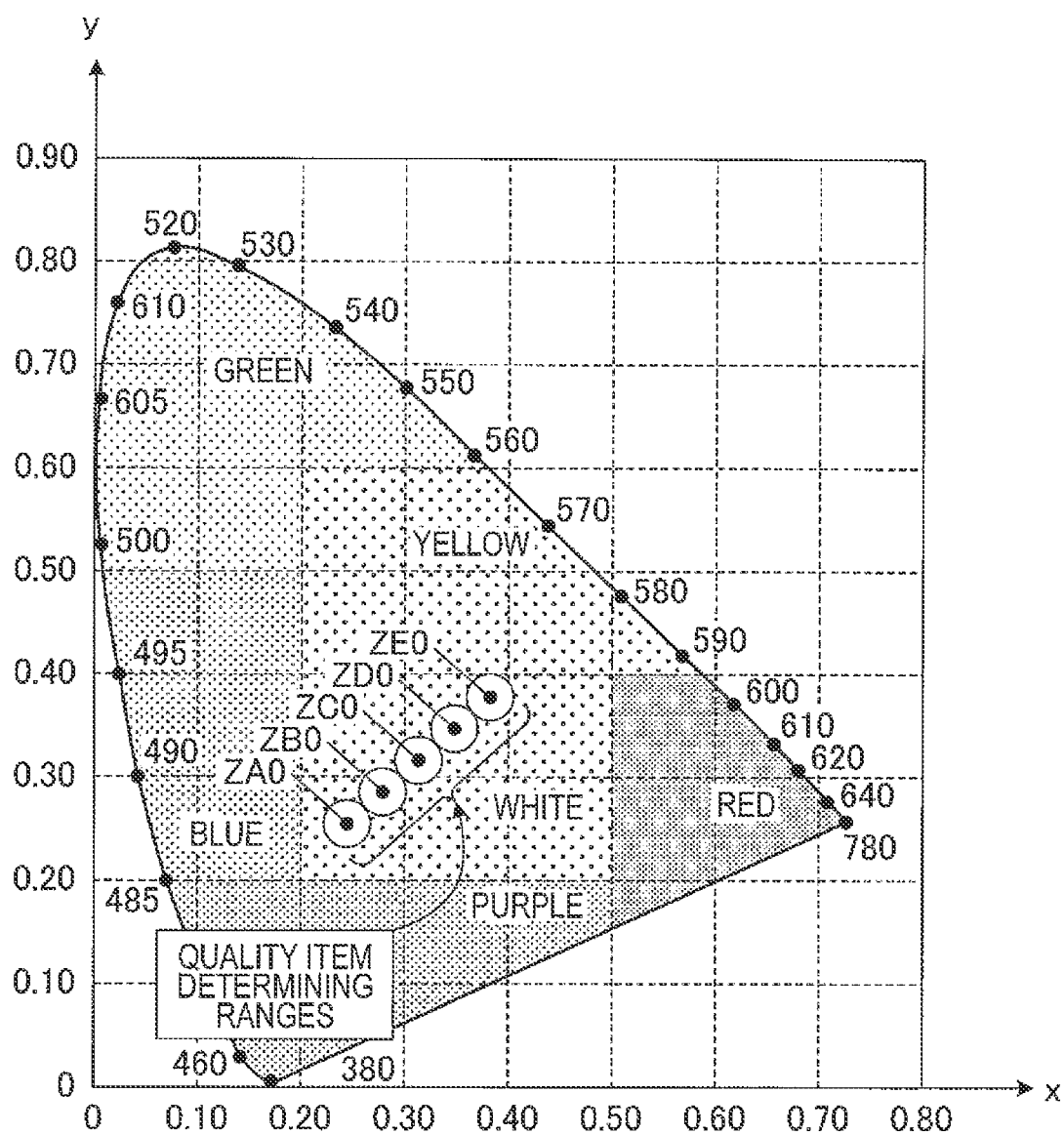
FIG. 15 is a chromaticity diagram which describes the threshold data for quality item determination the LED package manufacturing system of the embodiment of the present invention.

Then, the threshold data making process for the determination of quality items is performed (ST6). This process is performed to set the threshold (refer to threshold data 81a shown in FIG. 11) to determine quality items in the coating for production, and is performed repeatedly for the coating for production corresponding to each of the Bin codes [1], [2], [3], [4] and [5]. The threshold data making process is described in detail with reference to FIGS. 13, 14(a) to 14(c) and 15. In FIG. 13, first, the resin 8 which includes the fluorescent substance of a standard density prescribed in the resin coating information 14 is prepared (ST11). After having set this resin 8 in the resin discharging head 32, the resin discharging head 32 is moved to the test stage 40a of the testing and measuring unit 40, and the resin 8 is coated onto the light-passing member 43 with the prescribed coating quantity (appropriate resin coating quantity) shown in the resin coating information 14 (ST12). Then, the resin 8 coated on the light-passing member 43 is moved onto the light-passing member carrying unit 41, the LED element 5 is made to emit light, and the light emission characteristic when the resin 8 is in an unhardened state is measured by the light emission characteristic measuring unit of the above-mentioned construction (ST13). Based on light emission characteristic measurement values 39a which are the light emission characteristic measurement result measured by the light emission characteristic measuring unit, a quality item determining range of the measurement values, in which the light emission characteristic is determined to be that of a quality item, is set (ST14). As the threshold data 81a, the set quality item determining range is stored in the storage unit 81, and is transferred to the administrative computer 3 and stored in the storage unit 61 (ST15).

FIGS. 14(a) to 14(c) show the threshold data made in this way, namely, the light emission characteristic measurement values obtained when the resin is in an unhardened state after having coated the resin 8 that includes fluorescent substance of standard densities, and the quality item determining ranges (the threshold) of the measurement values to determine whether the light emission characteristic is that of quality items. FIGS. 14(a), 14(b) and 14(c) show thresholds corresponding to the Bin codes [1], [2], [3], [4] and [5] when the fluorescent substance densities in the resin 8 are 5%, 10% and 15%, respectively.

For example, as shown in FIG. 14(a), when the fluorescent substance density of the resin 8 is 5%, the coating quantity shown in each of the appropriate resin coating quantities 15(1) corresponds to each of the Bin codes 12b, and the measurement result after the light emission characteristic of the light that the resin 8 emits by irradiating blue light of the LED element 5 to the resin 8 coated with each of the coating quantities is measured by the light emission characteristic measuring unit is shown in the light emission characteristic measurement values 39a (1). Based on each of the light emission characteristic measurement values 39a (1), the threshold data 81a (1) are set. For example, the measurement result after the light emission characteristic of the resin 8 which is coated with the appropriate resin coating quantity VA0 corresponding to the Bin code [1] is measured is represented by a chromaticity coordinate point ZA0 (XA0, YA0) on the chromaticity table shown in FIG. 15. Around the chromaticity coordinate point ZA0, a predetermined range of the X coordinate and the Y coordinate on the chromaticity table (for example, +−10%) is set as the quality item determining range (threshold). For the appropriate resin coating quantities corresponding to other Bin codes [2] to [5], similarly, the quality item determining ranges (thresholds) are set based on the light emission characteristic measurement results (refer to the chromaticity coordinate points ZB0 to ZE0 on the chromaticity table shown in FIG. 15). Here, the predetermined range set as the threshold is appropriately set depending on the demanded precision level of the light emission characteristic of the LED package 50 as a product.

Likewise, FIGS. 14(b) and 14(c) show the light emission characteristic measurement values and the quality item determining ranges (thresholds) when the fluorescent substance densities of the resin 8 are 10% and 15%, respectively. In FIGS. 14(b) and 14(c), the appropriate resin coating quantities 15(2) and the appropriate resin coating quantities 15(3) respectively show the appropriate resin coating quantities when the fluorescent substance densities are 10% and 15%, respectively. The light emission characteristic measurement values 39a (2) and the light emission characteristic measurement values 39a (3) respectively show the light emission characteristic measurement values when the fluorescent substance densities are 10% and 15%, respectively, and the threshold data 81a (2) and the threshold data 81a (3) respectively show the quality item determining ranges (thresholds) when the fluorescent substance densities are 10% and 15%, respectively. The threshold data made in this way can be used properly in the coating operation for production based on the Bin code 12b which an LED element 5, on which the coating operation is performed, falls into. The threshold data making process shown in (ST6) may be performed as an off-line operation by an independent detecting device provided separately from the LED package manufacturing system 1, and the threshold data 81a that are stored in the administrative computer 3 beforehand may be transmitted to the resin coating device M4 via the LAN system 2 and used.

After this, the board 4 after the wire bonding is conveyed to the resin coating device M4 (ST7) and, as shown in FIG. 19(a), the resin 8 is discharged from the discharging nozzle 33a into the inside of the LED mounting unit 4b surrounded by the reflective unit 4c. Based on the map data 18, the threshold data 81a and the resin coating information 14, the operation of coating the its resin 8 of the prescribed quantity to cover the LED element 5 is performed, as shown in FIG. 19(b) (ST8). The resin coating operation is described in detail with reference to FIGS. 14(a) to 14(c) and 15. First, when the resin coating operation is started, the exchange of resin storing containers is performed as needed (ST21). That is, the dispenser 33 mounted to the resin discharging head 32 is exchanged with a dispenser 33 which accommodates the resin 8 the fluorescent substance density selected in response to the characteristic of the LED element 5.

Then, the resin 8 is test coated on the light-passing member 43 by the resin coating unit C for light emission characteristic measurement (testing step for measurement) (ST22). That is, the resin 8 of the appropriate resin coating quantity (VA0 to VE0) for either of the Bin codes 12b prescribed in FIG. 4 is coated on the light-passing member 43 which is led out to the test stage 40a in the testing and measuring unit 40. At this time, even if the resin discharging mechanism 35 is ordered with discharging parameters corresponding to the appropriate resin coating quantity (VA0 to VE0), the real resin coating quantity that is discharged by the discharging nozzle 33a and coated onto the light-passing member 43 is not necessarily the above appropriate resin coating quantity because of, for example, change of the characteristic of the resin 8 over time. As shown in FIG. 17(a), the real resin coating quantity becomes VA1 to VE1 which is somewhat different from VA0 to VE0.

Then, by sending the light-passing member 43 in the testing and measuring unit 40, the light-passing member 43, on which the resin 8 is test coated, is sent and carried on the light-passing member carrying unit 41 (light-passing member carrying step). The excitation light to excite the fluorescent substance is emitted from the light source unit 45 which is placed above the light-passing member carrying unit 41 (excitation light emitting step). The light that the resin 8 emits, when the excitation light is irradiated to the resin 8 which is coated on the light-passing member 43 from above, is received by the spectroscope 42 through the integrating sphere 44 from below the light-passing member 43, and the light emission characteristic of the light is measured by the light emission characteristic measuring processor 39 (light emission characteristic measuring step) (ST23).

Thereby, as shown in FIG. 17(b), the light emission characteristic measurement values represented in chromaticity coordinate points Z (refer to FIG. 15) are provided. This measurement result does not necessarily correspond to the light emission characteristic prescribed beforehand, namely, the standard chromaticity coordinate points ZA0 to ZE0 at the time of the appropriate resin coating shown in FIG. 14(a) because of, for example, the deviation of the above-mentioned coating quantity and the density change of the fluorescent substance particles of the resin 8. Therefore, the deviations (ΔXA, ΔYA) to (ΔXE, ΔYE) indicating the differences in the X and Y coordinates between the obtained chromaticity coordinate points ZA1 to ZE1 and the standard chromaticity coordinate points ZA0 to ZE0 at the time of the appropriate resin coating shown in FIG. 14(a) are obtained, and it is determined whether it is necessary to revise to obtain a desired light emission characteristic.

It is determined whether or not the measurement result is within the threshold (ST24). As shown in FIG. 17(c), by comparing the deviations obtained in (ST23) and the thresholds, it is determined whether the deviations (ΔXA, ΔYA) to (ΔXE, ΔYE) are within +−10% of ZA0 to ZE0. If the deviation is within the threshold, the discharging parameters corresponding to the set appropriate resin coating quantities VA0 to VE0 are just maintained. On the other hand, when the deviation exceeds the threshold, the coating quantity is revised (ST25). That is, the deviation between the measurement result in the light emission characteristic measuring step and the light emission characteristic prescribed beforehand is obtained, and as shown in FIG. 17(*d*), based on the obtained deviation, a process of deriving new appropriate resin coating quantities (VA2 to VE2) for practical production with which the resin 8 should be coated onto the LED element 5 is performed by the coating quantity deriving processor 38 (coating quantity deriving step).

The revised appropriate resin coating quantities (VA2 to VE2) are values updated by adding revision amounts corresponding to the deviations to the set appropriate resin coating quantities VA0 to VE0. The relation of the deviations and the revision amounts is recorded in the resin coating information 14 as known accompanied data beforehand. Based on the revised appropriate resin coating quantities (VA2 to VE2), the processes of (ST22), (ST23), (ST24) and (ST25) are performed repeatedly. By recognizing that the deviation between the measurement result in (ST24) and the light emission characteristic prescribed beforehand is within the threshold, the appropriate resin coating quantity for practical production is determined. That is, in the above-mentioned resin coating method, by repeatedly performing the coating step for measurement, the light-passing member carrying step, the excitation light emitting step, the light emission characteristic measuring step and the coating quantity deriving step, the appropriate resin coating quantity is derived with certainty. The determined appropriate resin coating quantity is stored in the storage unit 81 as the coating quantity 81*b* for practical production.

Figure 16:
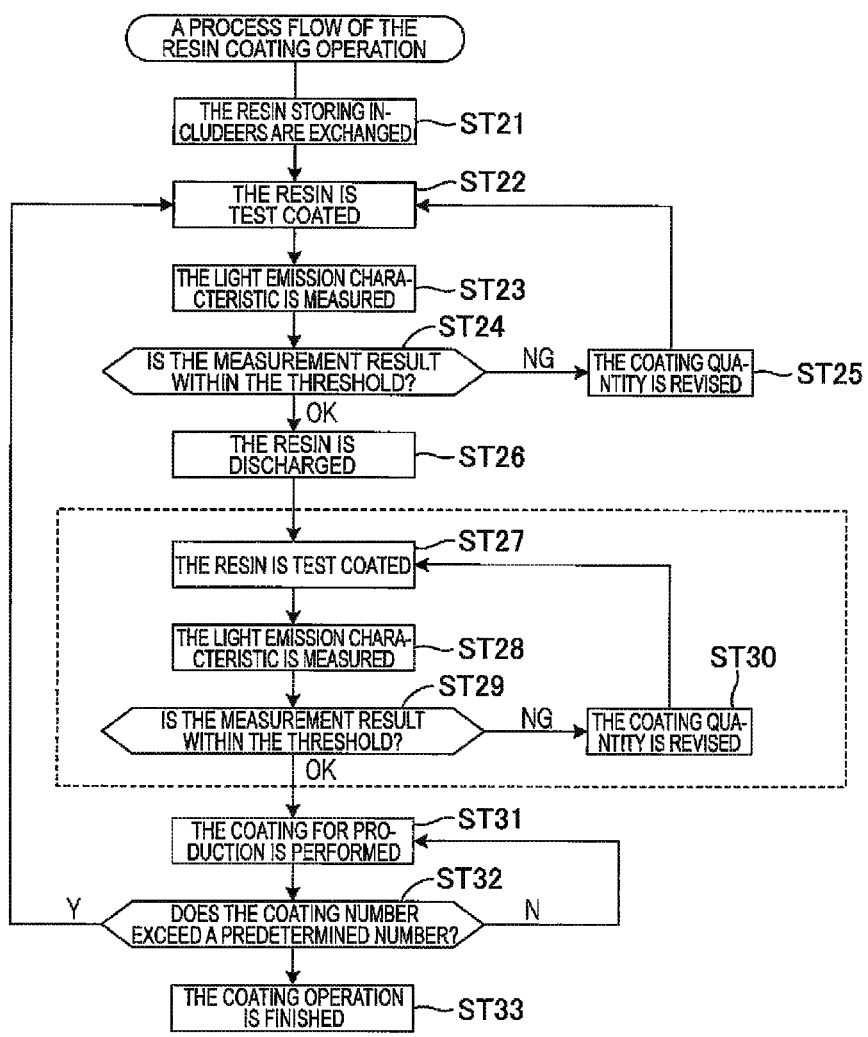
FIG. 16 is a flow diagram of a resin coating operation in an LED package manufacturing process of the LED package manufacturing system of the embodiment of the present invention.

After this, the flow shifts to the next step to perform the discharging (ST26). Here, by making the resin 8 of the predetermined quantity to be discharged from the discharging nozzle 33*a*, resin flow state in the resin discharge course is improved, and the movements of the dispenser 33 and the resin discharging mechanism 35 are stabilized. The processes of (ST27), (ST28), (ST29) and (ST30) shown with a broken line frame in FIG. 16 are performed similarly to the processes shown in (ST22), (ST23), (ST24) and (ST25). The processes of (ST27), (ST28), (ST29) and (ST30) are performed when it is necessary to carefully recognize that a desired light emission characteristic is completely ensured, and are not necessarily items that must be performed.

In this way, if the appropriate resin coating quantity to give the desired light emission characteristic is determined, the coating for production is performed (ST31). That is, when the production performing processor 37 orders the coating control unit 36, which controls the resin discharging mechanism 35, with the appropriate resin coating quantity that is derived by the coating quantity deriving processor 38 and is stored as the coating quantity 81*b* for practical production, the coating process for production, which coats the resin 8 of this appropriate resin coating quantity on the LED element 5 which is mounted on the board 4, is performed (production performing step).

In the process of repeatedly performing the coating process for production, the coating number by the dispenser 33 is counted, and it is its monitored whether the coating number exceeds a predetermined number that is set beforehand (ST32). That is, until this predetermined number is reached, the changes of the characteristic of the resin 8 and the fluorescent substance density are judged to be small, and the coating process for production (ST31) is repeated while the same coating quantity 81*b* for practical production is maintained. If it is recognized that the predetermined number is passed in (ST32), it is judged that there is the possibility that the characteristic of the resin 8 or the fluorescent substance density changes, and the flow returns to (ST22). Then, the same measurement of the light emission characteristic and the coating quantity revising process based on the measurement result are performed repeatedly.

Figure 19:
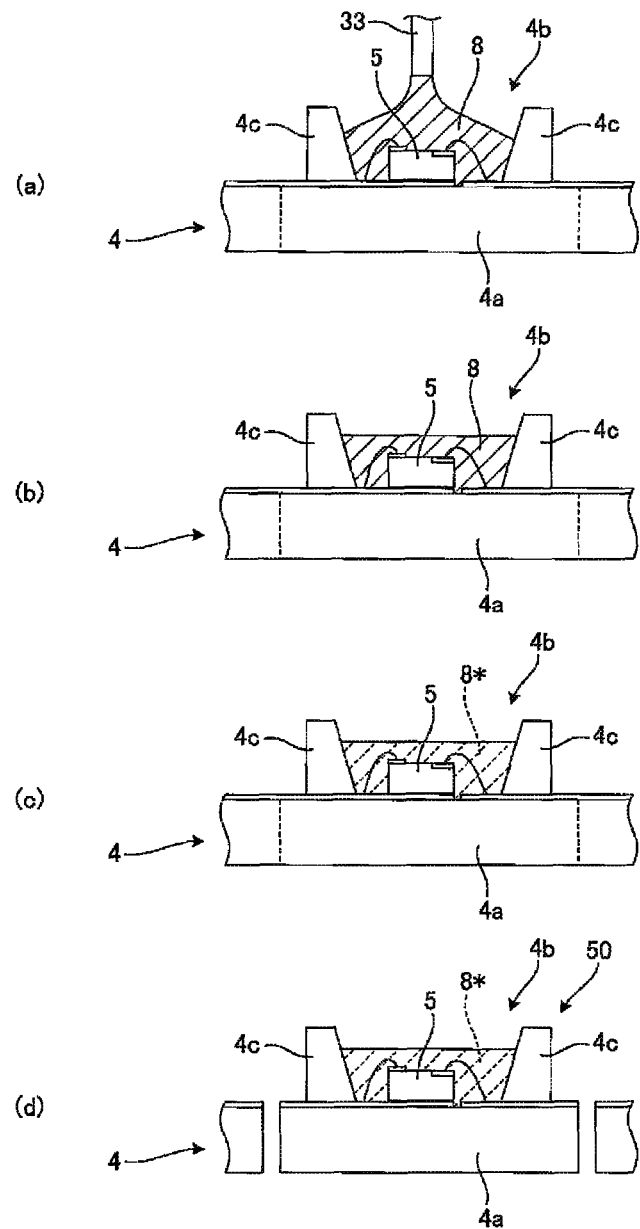
FIGS. 19(a) to 19(d) are step illustrations of the LED package manufacturing process of the LED package manufacturing system of the embodiment of the present invention.

When the resin coating on one piece of board 4 is finished in this way, the board 4 is sent to the curing device M5 and the resin 8 is hardened by heating with the curing device M5 (ST9). Thereby, as shown in FIG. 19(*c*), the resin 8 which is coated to cover the LED element 5 is thermally hardened and becomes the resin 8*, and is in an adhered state in the LED mounting unit 4*b*. Then, the board 4 after the resin curing is sent to the cutting device M6, and by cutting the board 4 for each of the individual boards 4*a*, as shown in FIG. 19 (*d*), the board 4 and the like are divided into individual LED packages 50 (ST10). Thereby, the LED package 50 is completed.

As described above, the LED package manufacturing system 1 shown in the above embodiment is constructed by including the component mounting device M1 which mounts the plurality of LED elements 5 on the board 4, the element characteristic information providing means which provides the information obtained by measuring the light emission wavelengths of the plurality of LED elements 5 individually beforehand, as the element characteristic information 12, the resin information providing means which provides the information that makes the appropriate resin coating quantity of the resin 8 to obtain the LED package 50 that possesses the prescribed light emission characteristic to correspond to the element characteristic information 12 as the resin coating information 14, the map data making means which makes the map data 18, which associate the mounting position information 71*a*, which indicates the positions in the board 4 of the LED elements 5 mounted by the component mounting device M1, with the element characteristic information 12 on the LED elements 5, for each board 4, and the resin coating device M4 which coats the resin 8 of the appropriate resin coating quantity to possess the prescribed light emission characteristic on each of the LED elements mounted on the board 4, based on the map data 18 and the resin coating information 14.

The resin coating device M4 is constructed by including the resin coating unit C which discharges a variable coating quantity of the resin 8 and coats the resin 8 at any coating positions, the coating control unit 36 which, by controlling the resin coating unit C, makes a coating process for measurement in which the resin 8 is test coated onto the light-passing member 43 for light emission characteristic measurement and a coating process for production in which the resin 8 is coated onto the LED element 5 for practical production to be performed, the light-passing member carrying unit 41 which includes the light source unit which emits excitation light to excite the fluorescent substance and on which the light-passing member 43 on which the resin 8 is test coated in the coating process for measurement is carried, the light emission characteristic measuring unit which measures the light emission characteristic of the light that the resin 8 emits when the excitation light emitted from the light source unit is irradiated to the resin 8 which is coated on the light-passing member 43, the coating quantity deriving processor 38 which obtains the deviation between the measurement result of the light emission characteristic measuring unit and the light emission characteristic prescribed beforehand, and derives an appropriate coating quantity for practical production with which the resin should be coated onto the LED element 5 by revising the appropriate resin coating quantity based on the deviation, and the production performing processor 37 which, by ordering the coating control unit 36 with the derived appropriate resin coating quantity, makes the coating process for production in which the appropriate resin coating quantity of the resin is coated on the LED element 5 to be performed.

With the above-mentioned construction, in the resin coating which is used in the manufacture of the LED package 50 which is made by covering the LED element 5 with the resin that includes fluorescent substance, the light-passing member 43 on which the resin 8 is test coated for light emission characteristic measurement is carried on the light-passing member carrying unit 41, a deviation between the measurement result obtained after the light that the resin 8 emits, when the light source unit 45, which is placed above, emits the excitation light which excites the fluorescent substance, and irradiates the excitation light from above to the resin 8 which is coated on the light-passing member 43, is received from below the light-passing member 43 and the light emission characteristic of the light is measured and the light emission characteristic prescribed beforehand is obtained, and an appropriate resin coating quantity with which the resin should be coated on the LED element 5 can be derived for practical production based on the deviation. Thereby, even if the light emission wavelengths of individual LED elements 5 vary, the light emission characteristics of LED packages 50 are equalized and the yield can be improved.

In the LED package manufacturing system 1 of the above-mentioned construction, although the construction that the administrative computer 3 and each device of the component mounting device M1 to cutting device M6 are connected with the LAN system 2 is shown, the LAN system 2 is not necessarily an essential component. That is, if there is a storing means which stores the element characteristic information 12 and the resin coating information 14 that are prepared beforehand and transmitted from outside for each of the LED packages 50, and there is a data providing means which can provide the element characteristic information 12 to the component mounting device M1 and the resin coating information 14 and the map data 18 to the resin coating device M4 from the storing means as necessary at any time, the functions of the LED package manufacturing system 1 shown in the present embodiment can be realized.

Although the present invention is described in detail with reference to the embodiments, it is apparent that various modifications and amendments may be made by those skilled in the art without departing from the spirit and scope of the invention.

This application is based on the Japanese patent application (patent application 2011-119989) filed on May 30, 2011, whose content is incorporated herein by reference.

INDUSTRIAL APPLICABILITY

The LED package manufacturing system of the invention has an effect that, even if the light emission wavelengths of individual LED elements vary, the light emission characteristics of LED packages are equalized and the yield can be improved, and is applicable in manufacturing an LED package of the construction that an LED element is covered with resin that includes fluorescent substance.

DESCRIPTION OF THE NUMBERS

1 LED package manufacturing system
2 LAN system
4 board
4a individual board
4b LED mounting unit
4c reflective nit
5 the LED element
8 resin
12 element characteristic information
13A, 13B, 13C, 13D and 13E LED sheet
14 resin coating information
18 map data
23 resin adhesive
24 adhesive transferring mechanism
25 component supply mechanism
26 component mounting mechanism
32 resin discharging head
33 dispenser
33a discharging nozzle
40 and 140 testing and measuring nit
40a test stage
41 and 141 light-passing member carrying unit
42 spectroscope
43 light-passing member
44 integrating sphere
46 irradiating unit
50 LED package

The invention claimed is:

1. A resin coating device which is used in an LED package manufacturing system for manufacturing an LED package made by covering an LED element mounted on a board with a resin that includes fluorescent substance, and which coats the resin to cover the LED element mounted on the board, the resin coating device comprising:
 a resin coating unit which discharges a variable coating quantity of the resin, and coats the resin at any coating positions;
 a coating control unit which, by controlling the resin coating unit, makes a coating process for measurement in which the resin is test coated onto a light-passing member for light emission characteristic measurement and an appropriate resin coating quantity is determined with which the resin is coated onto the LED element, and a coating process for production in which the resin with the determined appropriate resin coating quantity is coated onto the LED element for practical production to be performed;
 a light-passing member carrying unit on which the light-passing member on which the resin is test coated in the coating process for measurement is carried;
 a light source unit which is placed above the light-passing member carrying unit, and emits excitation light to excite the fluorescent substance;
 a light emission characteristic measuring unit which receives from below the light-passing member the light that the resin emits when the excitation light is irradiated from above to the resin which is coated on the light-passing member, and measures the light emission characteristic of the light;
 a coating quantity deriving processor which calculates a deviation between a measurement result of the light emission characteristic measuring unit and a previously specified light emission characteristic, and determines the appropriate resin coating quantity based on the deviation; and
 a production performing processor which, by ordering the coating control unit with the appropriate resin coating quantity, makes the coating process for production in which the appropriate resin coating quantity of the resin is coated on the LED element to be performed.

2. The resin coating device according to claim 1, wherein an LED package which emits white light is used as the light source unit.

3. The resin coating device according to claim 1, wherein the light emission characteristic measuring unit is made by placing an integrating sphere below the light-passing member, and the light that the resin emits is received through an opening of the integrating sphere.

4. A resin coating method which is used in an LED package manufacturing system for manufacturing an LED package which is made by covering an LED element mounted on a board with resin that includes fluorescent substance, and in which the resin is coated to cover the LED element mounted on the board, comprising
- a coating step for measurement in which the resin is test coated on a light-passing member for light emission characteristic measurement by a resin discharging unit which discharges a variable coating quantity of the resin;
- a light-passing member carrying step in which the light-passing member on which the resin is test coated is carried on a light-passing member carrying unit;
- an excitation light emitting step in which excitation light to excite the fluorescent substance is emitted from a light source unit which is placed above the light-passing member carrying unit, a light emission characteristic measuring step in which the light that the resin emits when the excitation light is irradiated from above to the resin which is coated on the light-passing member is received from below the light-passing member, and the light emission characteristic of the light is measured;
- a coating quantity determining step in which a deviation between a measurement result in the light emission characteristic measuring step and a previously specified light emission characteristic is calculated, and an appropriate resin coating quantity with which the resin should be coated onto the LED element as what is used for practical production is determined based on the deviation; and
- a production performing step in which, by ordering the coating control unit which controls the resin discharging unit with the determined appropriate resin coating quantity for the light-passing member with which the resin is test coated in the coating step for measurement, the coating process for production in which the appropriate resin coating quantity of the resin is coated on the LED element is performed.

5. The resin coating method according to claim 4, wherein an LED package which emits white light is used as the light source unit, and the light emission characteristic prescribed beforehand is the light emission characteristic that deviates from the normal light emission characteristic which is obtained from the finished product when the resin which is coated on the LED element is in a hardened state for a light emission characteristic difference because the resin is in an unhardened state.

6. The resin coating method according to claim 4, wherein, in the light emission characteristic measuring step, in a state of placing an integrating sphere below the light-passing member, the light that the resin emits is received through an opening of the integrating sphere.

7. The resin coating method according to claim 4, wherein by repeatedly performing the coating step for measurement, the light-passing member carrying step, the light emission characteristic measuring step and the coating quantity deriving step, the appropriate resin coating quantity is derived definitely.

8. The resin coating device according to claim 1, wherein the resin with the appropriate quantity in order to manufacture the LED package with previously specified light emission characteristic is coated onto the LED element on the board, which is based on map data which relates to mounting position information which indicates a position on the board onto which the LED element is mounted and element characteristic information which ranks the LED element by light emission wavelength of each LED element which is measured individually, and resin coating information which specifies the appropriate resin coating quantity in order to manufacture the LED package with the previously specified light emission characteristic according to a rank of the LED element in the element characteristic information.

* * * * *